US012713804B2

(12) United States Patent
Lim

(10) Patent No.: US 12,713,804 B2
(45) Date of Patent: Aug. 18, 2026

(54) DISPLAY APPARATUS

(71) Applicant: Samsung Display Co., Ltd., Yongin-si (KR)

(72) Inventor: Sanghyung Lim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 610 days.

(21) Appl. No.: 18/106,172

(22) Filed: Feb. 6, 2023

(65) Prior Publication Data

US 2024/0008336 A1 Jan. 4, 2024

(30) Foreign Application Priority Data

Jul. 4, 2022 (KR) ........................ 10-2022-0082136

(51) Int. Cl.
*H10K 59/38* (2023.01)
*H10K 59/80* (2023.01)

(52) U.S. Cl.
CPC ........... *H10K 59/38* (2023.02); *H10K 59/878* (2023.02)

(58) Field of Classification Search
CPC .... H10K 59/38; H10K 59/878; H10K 59/871; H10K 59/873; H10K 59/879; H10K 2102/331; H10K 50/81; H10K 50/82; H10K 50/852; H10K 50/856; H10K 50/858; H10K 50/86; H10K 59/35
See application file for complete search history.

(56) References Cited

U.S. PATENT DOCUMENTS 10,670,901 B2 6/2020 Lee et al.
2015/0171372 A1 6/2015 Iwata et al.
2016/0372528 A1* 12/2016 Kamura ................. H10K 30/87
2017/0315289 A1* 11/2017 Cha ...................... G02B 6/0023
2020/0091464 A1* 3/2020 Park ...................... H10K 50/19
2021/0296604 A1 9/2021 Lim et al.
2021/0359009 A1 11/2021 Lee et al.

FOREIGN PATENT DOCUMENTS

JP 2015128027 A * 7/2015 ........... H10K 59/879
KR 10-2019-0057190 5/2019
KR 10-2021-0118292 9/2021
KR 10-2021-0142031 11/2021

* cited by examiner

*Primary Examiner* — Steven B Gauthier
*Assistant Examiner* — Alvin L Lee
(74) *Attorney, Agent, or Firm* — CANTOR COLBURN LLP

(57) ABSTRACT

A display apparatus includes a lower substrate and a plurality of light-emitting elements disposed over the lower substrate, each light-emitting element including a first-color emission layer. An upper substrate is disposed over the lower substrate and has a plurality of grooves in a lower surface facing the lower substrate. A reflective layer is disposed on entire inner side surfaces of the grooves. Color filter layers are respectively located in the grooves and contact bottom surfaces of the grooves. A first low-refractive-index layer is located in a first groove, and second and third low-refractive-index layers and corresponding quantum dot layers are located in second and third grooves.

19 Claims, 15 Drawing Sheets

400a
403
405
407
409
400b
305
303
150
140
131
121
110
100
400
410a
410
413
415
417
440a
440
415'
420a
420
423
425
427
415'
440
430a
430
433
435
437
SP
311
321
331
PX1
PX2
PX3
215b
211
213
215a
210
225b
221
223
225a
220
235b
231
233
235a
230
Z
Y
X

DISPLAY APPARATUS

CROSS REFERENCE TO RELATED APPLICATION(S)

This application claims priority to and benefits of Korean Patent Application No. 10-2022-0082136 under 35 U.S.C. § 119, filed on Jul. 4, 2022, in the Korean Intellectual Property Office (KIPO), the entire contents of which are incorporated herein by reference.

BACKGROUND

1. Technical Field

One or more embodiments relate to a display apparatus, and more particularly, to a display apparatus having a low defect rate in a manufacturing operation and in which an amount of materials consumed in the manufacturing operation may be reduced.

2. Description of the Related Art

A display apparatus has pixels. For a full-color display apparatus, pixels may emit different colors of light. To this end, at least some pixels of the display apparatus have a color converting unit. Accordingly, light having a first color generated by a light-emitting unit of some pixels is converted into light having a second color while passing through the corresponding color converting unit, and is emitted to the outside.

SUMMARY

However, in such a display apparatus in the related art, an excessive amount of materials for forming a color converting unit or the like is required in a manufacturing operation of the display apparatus, or the possibility of occurring a defect is high during a manufacturing operation or an operation of using the display apparatus after manufacturing.

One or more embodiments include a display apparatus having a low defect rate in a manufacturing operation and in which the amount of materials consumed in the manufacturing operation may be reduced. However, these problems are an example, and the scope of the disclosure is not limited thereto.

Additional aspects will be set forth in part in the description which follows and, in part, will be apparent from the description, or may be learned by practice of the embodiments of the disclosure.

According to one or more embodiments, a display apparatus includes a lower substrate, a first light-emitting element to a third light-emitting element each of which is disposed over the lower substrate and comprises a first-color emission layer, an upper substrate which has a first groove to a third groove in a lower surface of the upper substrate facing the lower substrate, disposed over the lower substrate such that the first light-emitting element to the third light-emitting element are disposed between the upper substrate and the lower substrate, a reflective layer disposed on an inner side surface of each of the first groove to the third groove, a first-color color filter layer and a first low-refractive-index layer located in the first groove, a second-color color filter layer, a second low-refractive-index layer, and a second-color quantum dot layer located in the second groove, and a third-color color filter layer, a third low-refractive-index layer, and a third-color quantum dot layer located in the third groove.

The first light-emitting element to the third light-emitting element may further include a first pixel electrode to a third pixel electrode, and an opposite electrode corresponding to the first pixel electrode to the third pixel electrode, and the first-color emission layer may be disposed over the first pixel electrode to the third pixel electrode to be disposed between the first pixel electrode to the third pixel electrode and the opposite electrode.

The first-color emission layer may emit light in a first wavelength band, the second-color quantum dot layer may convert the light in the first wavelength band into light in a second wavelength band, and the third-color quantum dot layer may convert the light in the first wavelength band into light in a third wavelength band.

The reflective layer may cover a portion of the lower surface of the upper substrate, the portion being outside the first groove to the third groove.

The second-color quantum dot layer may be disposed between the second-color color filter layer and the second light-emitting element, the third-color quantum dot layer may be disposed between the third-color color filter layer and the third light-emitting element, the first low-refractive-index layer may be disposed between the first-color color filter layer and the first light-emitting element, the second low-refractive-index layer may be disposed between the second-color color filter layer and the second-color quantum dot layer, and the third low-refractive-index layer may be disposed between the third-color color filter layer and the third-color quantum dot layer.

The first-color color filter layer may contact a bottom surface of the first groove, the second-color color filter layer may contact a bottom surface of the second groove, and the third-color color filter layer may contact a bottom surface of the third groove.

The display apparatus may further include a first protective layer, wherein the first protective layer may be disposed between: the first-color color filter layer and the first low-refractive-index layer, the second-color color filter layer and the second low-refractive-index layer, and the third-color color filter layer and the third low-refractive-index layer.

The first protective layer may be integral as a single body over an entire surface of the upper substrate.

The display apparatus may further include a second protective layer, wherein the second protective layer may be disposed between: the second low-refractive-index layer and the second-color quantum dot layer, and between the third low-refractive-index layer and the third-color quantum dot layer.

The second protective layer may be integral as a single body over an entire surface of the upper substrate.

The display apparatus may further include a transparent layer in the first groove to be disposed between the first low-refractive-index layer and the first light-emitting element.

The second protective layer may be disposed between the first low-refractive-index layer and the transparent layer.

The second protective layer may contact the first protective layer over a portion of the lower surface of the upper substrate, the portion being outside the first groove to the third groove.

The display apparatus may further include a third protective layer, wherein the third protective layer may be disposed between the second-color quantum dot layer and the second light-emitting element, and between the third-color quantum dot layer and the third light-emitting element.

The third protective layer may be integral as a single body over an entire surface of the upper substrate.

The third protective layer may contact the second protective layer on a portion of the lower surface of the upper substrate, the portion being outside the first groove to the third groove.

The upper substrate may have an additional groove in the lower surface of the upper substrate facing the lower substrate, the second protective layer may contact the first protective layer over a bottom surface of the additional groove, and the third protective layer may contact the second protective layer over the bottom surface of the additional groove.

A step-difference may be formed between a first portion of a surface of the third protective layer facing the lower substrate and a second portion of the surface of the third protective layer facing the lower substrate. The first portion may be disposed over the bottom surface of the additional groove, and the second portion may be outside the first groove to the third groove and the additional groove.

The upper substrate may comprise an additional groove in the lower surface of the upper substrate facing the lower substrate, and further include an additional low-refractive-index layer located in the additional groove and disposed between the first protective layer and the second protective layer, and the third protective layer may contact the second protective layer in the additional groove.

In at least one groove of the first groove to the third groove, a step-difference may be formed between a first portion of a surface of the third protective layer facing the lower substrate and a second portion of the surface of the third protective layer facing the lower substrate. The first portion may be disposed over a bottom surface of the at least one groove, and the second portion may be outside the first groove to the third groove.

When viewed from a direction perpendicular to the upper substrate, the first groove to the third groove may overlap the first light-emitting element to the third light-emitting element.

Other aspects, features, and advantages other than those described above will now become apparent from the following drawings, claims, and the detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
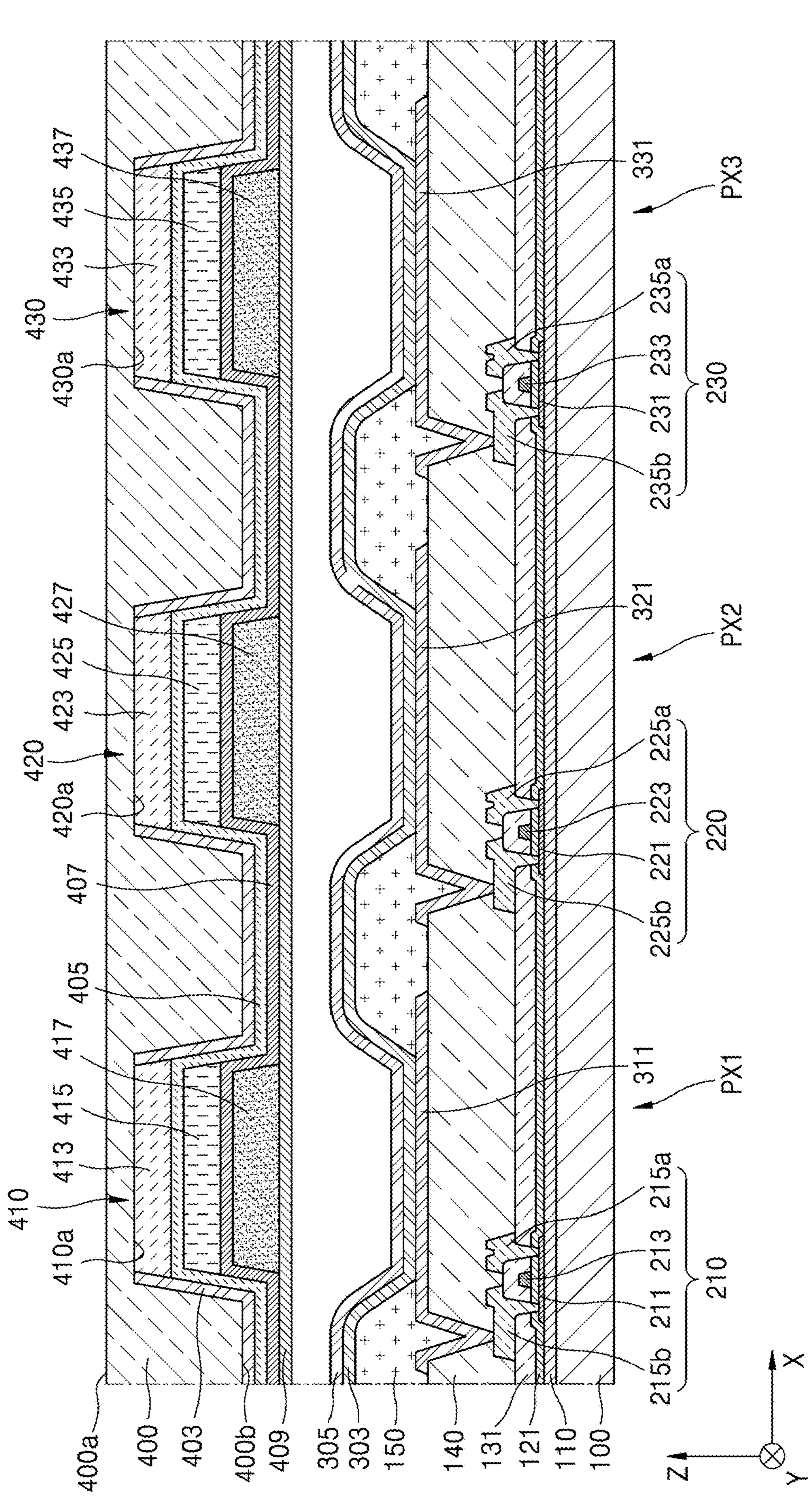
FIG. 1 is a cross-sectional view schematically illustrating a portion of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

As the disclosure allows for various changes and numerous embodiments, particular embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the embodiments set forth herein.

The disclosure will now be described more fully with reference to the accompanying drawings, in which embodiments of the disclosure are shown. Like reference numerals in the drawings denote like elements, and thus their description will be omitted.

It will be understood that when a layer, region, or component is referred to as being "formed on" another layer, region, or component, it can be directly or indirectly formed on the other layer, region, or component, for example, intervening layers, regions, or components may be present. Sizes of components in the drawings may be exaggerated for convenience of explanation. In other words, since sizes and thicknesses of components in the drawings are arbitrarily illustrated for convenience of explanation, the following embodiments are not limited thereto.

The x-axis, the y-axis, and the z-axis are not limited to three axes on the orthogonal coordinates system, and may be interpreted in a broad sense including the same. For example, the x-axis, the y-axis, and the z-axis may be perpendicular to one another, or may represent different directions that are not perpendicular to one another.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a cross-sectional view schematically illustrating a portion of a display apparatus according to an embodiment. As shown in FIG. 1, the display apparatus according to an embodiment may have a first pixel PX1 to a third pixel PX3. This is merely an example, and the display apparatus may include more pixels. Although FIG. 1 illustrates that the first pixel PX1 to the third pixel PX3 are adjacent to each other, the disclosure is not limited thereto. For example, other components, such as other lines or the like, may also be disposed between the first pixel PX1 to the third pixel PX3. Accordingly, for example, the first pixel PX1 and the second pixel PX2 may not be pixels adjacent to each other. Cross-sections of the first pixel PX1 to the third pixel PX3 in FIG. 1 may not be cross-sections in a same direction.

The display apparatus according to an embodiment may have a lower substrate 100. The lower substrate 100 may include glass, metal, or a polymer resin. In case that the lower substrate 100 is flexible or bendable, the lower substrate 100 may include, for example, a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The lower substrate 100 may have a multi-layered structure including two layers each including the polymer resin and a barrier layer including an inorganic material (silicon oxide, silicon nitride, silicon oxynitride, or the like) between the two layers, and various modifications may be made.

A first pixel electrode 311, a second pixel electrode 321, and a third pixel electrode 331 may be disposed above the lower substrate 100. For example, display elements are on the lower substrate 100. In addition to the display elements, first to third thin-film transistors 210, 220, and 230 each of which is electrically connected to a corresponding one of the display elements may also be over the lower substrate 100. FIG. 1 illustrates that organic light-emitting devices are on the lower substrate 100 as display elements. The organic light-emitting devices being electrically connected to the first to third thin-film transistors 210, 220, and 230 may be understood as that the first to third pixel electrodes 311, 321, and 331 are electrically connected to the first to third thin-film transistors 210, 220, and 230.

In an embodiment, FIG. 1 illustrates that the first thin-film transistor 210 is located in the first pixel PX1, the second thin-film transistor 220 is located in the second pixel PX2, the third thin-film transistor 230 is located in the third pixel PX3, and each of the first thin-film transistor 210 to the third thin-film transistor 230 is electrically connected to a pixel electrode of a display element in a corresponding pixel. Hereinafter, for convenience of description, the first thin-film transistor 210 and a display element connected thereto are described, and descriptions thereof may also be applied to the second thin-film transistor 220, the third thin-film transistor 230, and display elements connected thereto. For example, descriptions of a second semiconductor layer 221, a second gate electrode 223, a second source electrode 225*a*, and a second drain electrode 225*b* of the second thin-film transistor 220 are omitted, and a description of the second pixel electrode 321 is also omitted. Similarly, descriptions of a third semiconductor layer 231, a third gate electrode 233, a third source electrode 235*a*, and a third drain electrode 235*b* of the third thin-film transistor 230 are omitted, and a description of the third pixel electrode 331 is also omitted.

The first thin-film transistor 210 may include a first semiconductor layer 211 including amorphous silicon, polycrystalline silicon, an organic semiconductor material, or an oxide semiconductor material, a first gate electrode 213, a first source electrode 215*a*, and a first drain electrode 215*b*. The first gate electrode 213 may include various conductive materials and have various layered structures, for example, may include a Mo layer and an Al layer. As another example, the first gate electrode 213 may include a $TiN_x$ layer, an Al layer and/or a Ti layer. The first source electrode 215*a* and the first drain electrode 215*b* may also include various conductive materials and have various layered structures, for example, may include a Ti layer, an Al layer and/or a Cu layer.

To secure insulation between the first semiconductor layer 211 and the first gate electrode 213, a first gate insulating film 121 including an inorganic material, such as silicon oxide, silicon nitride and/or silicon oxynitride, or the like, may be disposed between the first semiconductor layer 211 and the first gate electrode 213. Also, a first interlayer insulating film 131 including an inorganic material, such as silicon oxide, silicon nitride and/or silicon oxynitride, or the like, may be disposed on the first gate electrode 213, and the first source electrode 215*a* and the first drain electrode 215*b* may be disposed on the first interlayer insulating film 131. An insulating film including the inorganic material may be formed through chemical vapor deposition (CVD) or atomic layer deposition (ALD). The above description may be similar to the embodiments and modification examples thereof to be described below.

In an embodiment, FIG. 1 illustrates that the first thin-film transistor 210 includes the first source electrode 215*a* and the first drain electrode 215*b*, but the disclosure is not limited thereto. For example, the first source electrode 215*a* and/or the first drain electrode 215*b* may be a portion of a line. As another example, the first thin-film transistor 210 may not have the first source electrode 215*a* and/or the first drain electrode 215*b*, and a source area of the first semiconductor layer 211 may function as a source electrode, or a drain area thereof may function as a drain electrode. For example, the source area of the first semiconductor layer 211 of the first thin-film transistor 210 may be integrated with a drain area of another thin-film transistor. It may be understood that a drain electrode of the another thin-film transistor may be electrically connected to the source electrode of the first thin-film transistor 210. The above embodiment may be also similar to the embodiments of the second thin-film transistor 220 and the third thin-film transistor 230.

A buffer layer 110 including an inorganic material, such as silicon oxide, silicon nitride and/or silicon oxynitride, or the like, may be disposed between the first thin-film transistor 210 in such a structure and the lower substrate 100. The buffer layer 110 may increase a smoothness of an upper surface of the lower substrate 100 or may prevent or minimize penetration of impurities from the lower substrate 100 or the like into the first semiconductor layer 211 of the first thin-film transistor 210.

Also, a planarization layer 140 may be disposed on the first thin-film transistor 210. For example, as shown in FIG. 1, in case that an organic light-emitting device is disposed above the first thin-film transistor 210, the planarization layer 140 may substantially planarize an upper portion of a protective film covering the first thin-film transistor 210. The planarization layer 140 may include, for example, an organic material, such as acryl, benzocyclobutene (BCB), hexamethyldisiloxane (HMDSO), or the like. Although FIG. 1 illustrates the planarization layer 140 as a single layer, various modifications are possible, for example, the planarization layer 140 may be a multi-layer.

A display element may be disposed on the planarization layer 140 of the lower substrate 100. An organic light-emitting device as shown in FIG. 1 may be used as the display element. In the embodiment of the first pixel PX1, the organic light-emitting device may have, for example, the first pixel electrode 311, an opposite electrode 305, and an intermediate layer 303 disposed therebetween and including an emission layer. As shown in FIG. 1, the first pixel electrode 311 may be electrically connected to the first thin-film transistor 210 by contacting any one of the first source electrode 215*a* and the first drain electrode 215*b* through an opening portion formed in the planarization layer 140 or the like. The second pixel PX2 may have the second pixel electrode 321, and the third pixel PX3 may have the third pixel electrode 331. The first pixel electrode 311 to the third pixel electrode 331 may each include a transparent conductive layer and a reflective layer, wherein the transparent conductive layer may include a transparent conductive oxide such as ITO, $In_2O_3$, or IZO, and the reflective layer may include a metal such as Al, Ag, or the like. For example, the first pixel electrode 311 to the third pixel electrode 331 may each have a triple-layered structure of ITO/Ag/ITO. However, the embodiments are not limited thereto.

The intermediate layer 303 including the emission layer may be integral over the first pixel electrode 311 to the third pixel electrode 331, and the opposite electrode 305 on the intermediate layer 303 may also be integral over the first pixel electrode 311 to the third pixel electrode 331. The opposite electrode 305 may include a transparent conductive layer including ITO, $In_2O_3$, or IZO, and may also include a semi-transparent film including a metal such as Al, Ag, or the like. For example, the opposite electrode 305 may include a semi-transparent film including MgAg. However, the embodiments are not limited thereto.

A pixel defining layer 150 may be disposed on the planarization layer 140. The pixel defining layer 150 may define a pixel by having an opening corresponding to each of pixels, for example, an opening through which at least a central portion of each of the first pixel electrode 311 to the third pixel electrode 331 may be exposed. As shown in FIG. 1, the pixel defining layer 150 prevents an arc or the like from being occurred at an edge of each of the first pixel electrode 311 to the third pixel electrode 331 by increasing a distance between the edge of each of the first pixel electrode 311 to the third pixel electrode 331 and the opposite electrode 305. The pixel defining layer 150 may include, for example, an organic material, such as polyimide, HMDSO (hexamethyldisiloxane), or the like.

The intermediate layer 303 may include a low-molecular-weight material or a polymer material. In case that the intermediate layer 303 includes a low-molecular-weight material, the intermediate layer 303 may include a structure in which a hole injection layer (HIL), a hole transport layer (HTL), an emission layer (EML), an electron transport layer (ETL), an electron injection layer (EIL), or the like are stacked each other in a single or complex structure, and may be formed by a method of vacuum deposition. In case that the intermediate layer 303 includes a polymer material, the intermediate layer 303 may have a structure including a HTL and an EML. At this time, the HTL may include poly(3,4-ethylenedioxythiophene) (PEDOT), and the EML may include a polymer material, such as a poly (p-phenylene vinylene) (PPV)-based polymer material, a polyfluorene-based polymer material, or the like. The intermediate layer 303 may be formed by a screen printing method, an inkjet printing method, a vapor deposition method, a laser induced thermal imaging (LITI) method, or the like. The intermediate layer 303 is not limited thereto and may have various structures.

As described above, the intermediate layer 303 may include a layer integral as a single body over the first pixel electrode 311 to the third pixel electrode 331, but if necessary, the intermediate layer 303 may also include a layer patterned to correspond to each of the first pixel electrode 311 to the third pixel electrode 331. The intermediate layer 303 may include a first-color emission layer. The first-color emission layer may be integral as a single body over the first pixel electrode 311 to the third pixel electrode 331, and if necessary, the first-color emission layer may be patterned to correspond to each of the first pixel electrode 311 to the third pixel electrode 331. The first-color emission layer may emit light having a wavelength in a first wavelength band, for example, may emit light having a wavelength in a range of about 450 nm to about 495 nm.

The opposite electrode 305 may be on the intermediate layer 303 to correspond to the first pixel electrode 311 to the third pixel electrode 331. The opposite electrode 305 may be integral in organic light-emitting devices.

Because the organic light-emitting device may be readily damaged by moisture or oxygen from an outside, an encapsulation layer (not shown) may cover the organic light-emitting device to protect the organic light-emitting device if necessary. The encapsulation layer may include a first inorganic encapsulation layer, an organic encapsulation layer, and a second inorganic encapsulation layer.

An upper substrate 400 may be disposed above the lower substrate 100 such that the opposite electrode 305 is disposed between the upper substrate 400 and the lower substrate 100. The upper substrate 400 may include glass, metal, or a polymer resin. In case that the upper substrate 400 is flexible or bendable, the upper substrate 400 may include, for example, a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The upper substrate 400 may have a multi-layered structure including two layers each including the polymer resin and a barrier layer including an inorganic material (silicon oxide, silicon nitride, silicon oxynitride, or the like) between the two layers, and various modifications may be made.

The upper substrate 400 may have a first groove 410 to a third groove 430 in a lower surface 400*b* in a direction (−Z direction) of the lower substrate 100. The first groove 410 to the third groove 430 may correspond to the first pixel electrode 311 to the third pixel electrode 331, respectively. The first groove 410 to the third groove 430 respectively corresponding to the first pixel electrode 311 to the third pixel electrode 331 means that each of the first groove 410 to the third groove 430 may overlap a corresponding one of the first light-emitting element to the third light-emitting element respectively, when viewed in a direction perpendicular to the upper substrate 400. For example, when the display apparatus is viewed in a direction (Z direction) perpendicular to the lower substrate 100, the first groove 410 may overlap the first pixel electrode 311, the second groove 420 may overlap the second pixel electrode 321, and the third groove 430 may overlap the third pixel electrode 331.

An inner side surface of each of the first groove 410 to the third groove 430 of the upper substrate 400 may be inclined with respect to the lower surface 400*b* of the upper substrate 400. At this time, an area of a cross-section of each of the first groove 410 to the third groove 430 by a virtual plane (XY plane) parallel to the lower surface 400*b* of the upper substrate 400 may decrease from the lower surface 400*b* to an upper surface 400*a* of the upper substrate 400.

A reflective layer 403 may be located in the first groove 410 to the third groove 430. The reflective layer 403 may be disposed on an inner side surface of each of the first groove 410 to the third groove 430. The reflective layer 403 may include a reflective metal such as Al, Ag, or the like. As shown in FIG. 1, the reflective layer 403 may be not only in the first groove 410 to the third groove 430, but may also be on the lower surface 400*b* of the upper substrate 400 facing the lower substrate 100. The reflective layer 403 may cover a portion of the lower surface 400*b* of the upper substrate 400, the portion being outside the first groove 410 to the third groove 430. The reflective layer 403 may not cover at least a portion of each of a first bottom surface 410*a* (in +Z direction) of the first groove 410, a second bottom surface 420*a* (in +Z direction) of the second groove 420, and a third bottom surface 430*a* (in +Z direction) of the third groove 430.

A first-color color filter layer 413 and a first low-refractive-index layer 415 may be located in the first groove 410. Also, a second-color color filter layer 423, a second low-refractive-index layer 425, and a second-color quantum dot layer 427 may be located in the second groove 420, and a third-color color filter layer 433, a third low-refractive-index layer 435, and a third-color quantum dot layer 437 may be located in the third groove 430.

The first-color color filter layer 413 may only allow light having a wavelength in a range of about 450 nm to about 495 nm to pass through, the second-color color filter layer 423 may only allow light having a wavelength in a range of about 495 nm to about 570 nm to pass through, and the third-color color filter layer 433 may only allow light having a wavelength in a range of about 630 nm to about 780 nm to pass through. The first-color color filter layer 413 to the third-color color filter layer 433 may reduce external light reflection in a display apparatus.

For example, when external light reaches the first-color color filter layer 413, only light having a preset wavelength as described above may pass through the first-color color filter layer 413, and light having other wavelengths may be absorbed by the first-color color filter layer 413. According, only the light having the preset wavelength as described above among the external light incident on the display apparatus passes through the first-color color filter layer 413, and a portion of light passing through the first-color color filter layer 413 may be reflected by the opposite electrode 305 or the first pixel electrode 311 therebelow, and may be emitted to the outside again. As a result, because only a portion of external light incident on a place where the first pixel PX1 is located is reflected to the outside, the first-color color filter layer 413 may reduce the external light reflection. The above descriptions may also be applied to the second-color color filter layer 423 and the third-color color filter layer 433.

The first low-refractive-index layer 415 may increase brightness in the first pixel PX1. A second protective layer 407 on a surface of the first low-refractive-index layer 415 in a direction (−Z direction) of the first pixel electrode 311 may include silicon oxide, silicon nitride, silicon oxynitride, aluminum oxide, or the like and a refractive index of the first low-refractive-index layer 415 may be lower than a refractive index of the second protective layer 407. Accordingly, after a portion of light emitted from the first-color emission layer of the intermediate layer 303 in the first pixel PX1 and directed to the first low-refractive-index layer 415 is reflected at an interface between the second protective layer 407 and the first low-refractive-index layer 415 and is directed to the first pixel electrode 311, the portion of light may be reflected by the first pixel electrode 311 and may be made to proceed toward the first low-refractive-index layer 415. Through the above operation, an optical resonance effect may occur in the first pixel PX1 to increase the brightness in the first pixel PX1.

In an embodiment, as described above, the second protective layer 407 disposed over a surface of the first low-refractive-index layer 415 facing the first pixel electrode 311 may include silicon oxide, silicon nitride, silicon oxynitride, or aluminum oxide. Because the refractive index of silicon oxide is about 1.457 for light having a wavelength of about 632.8 nm, the refractive index of the first low-refractive-index layer 415 may be, for example, in a range of about 1.25 to about 1.3. The first low-refractive-index layer 415 may include, for example, an ultraviolet curable transparent resin. Examples of an ultraviolet curable transparent resin for the first low-refractive-index layer 415 may include a resin including polyester, polyimide, polyether, acrylic, epoxy, urethane, polybutadiene, (meth)acrylate, or the like, or any combination thereof. However, the embodiments are not limited thereto.

As the second low-refractive-index layer 425 is located in the second pixel PX2 and the third low-refractive-index layer 435 is located in the third pixel PX3, a function of the second low-refractive-index layer 425 in the second pixel PX2 and a function of the third low-refractive-index layer 435 in the third pixel PX3 may be a same as/similar to a function of the first low-refractive-index layer 415 in the first pixel PX1. The second low-refractive-index layer 425 and the third low-refractive-index layer 435 may include a substantially same material as that of the first low-refractive-index layer 415. Also, if necessary, the first low-refractive-index layer 415, the second low-refractive-index layer 425, and the third low-refractive-index layer 435 may each be formed by using a resin having hollow silica.

The second-color quantum dot layer 427 may convert light in a first wavelength band generated by the intermediate layer 303 on the second pixel electrode 321 into light in a second wavelength band. For example, in case that light having a wavelength in a range of about 450 nm to about 495 nm is generated by the intermediate layer 303 on the second pixel electrode 321, the second-color quantum dot layer 427 may convert the light into light having a wavelength in a range of about 495 nm to about 570 nm. Accordingly, the light having a wavelength in a range of about 495 nm to about 570 nm may be emitted from the second pixel PX2 to the outside through the upper substrate 400.

The third-color quantum dot layer 437 may convert light in a first wavelength band generated by the intermediate layer 303 on the third pixel electrode 331 into light in a third wavelength band. For example, in case that light having a wavelength in a range of about 450 nm to about 495 nm is generated by the intermediate layer 303 on the third pixel electrode 331, the third-color quantum dot layer 437 may convert the light into light having a wavelength in a range of about 630 nm to about 780 nm. Accordingly, the light having a wavelength in a range of about 630 nm to about 780 nm may be emitted from the third pixel PX3 to the outside through the upper substrate 400.

In the embodiment, embodiments to be described below, and modifications thereof, a quantum dot refers to a crystal of a semiconductor compound, and may include any material capable of emitting light having various emission wavelengths depending on the size of the crystal. A diameter of the quantum dot may be, for example, in a range of about 1 nm to about 10 nm.

The quantum dot may be synthesized by a wet chemical operation, an organometallic chemical vapor deposition operation, a molecular beam epitaxy operation, a similar operation, or the like. The wet chemical operation may be a method of growing quantum dot particle crystals after mixing an organic solvent and a precursor material. In the embodiment of the wet chemical operation, when the quantum dot particle crystals grow, the organic solvent acts as a dispersant naturally coordinated on the surface of the quantum dot particle crystals and adjusts the growth of the quantum dot particle crystals, and thus, the wet chemical operation may be easier than vapor deposition methods, such as metal organic chemical vapor deposition (MOCVD), molecular beam epitaxy (MBE), or the like. The wet chemical operation may be a low-cost operation and may control the growth of quantum dot particle crystals.

Such a quantum dot may include a Group III-VI semiconductor compound, a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of the Group II-VI semiconductor compound may include a binary compound such as CdS, CdSe, CdTe, ZnS, ZnSe, ZnTe, ZnO, $ZnO_2$, HgS, HgSe, HgTe, MgSe, MgS, or the like, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or the like, a quaternary compound such as CdZnSeS, CdZnSeTe, CdZnSTe, CdHgSeS, CdHgSeTe, CdHgSTe, HgZnSeS, HgZnSeTe, HgZnSTe, or the like, or any combination thereof. However, the embodiments are not limited thereto.

Examples of the Group III-V semiconductor compound may include a binary compound such as GaN, GaP, GaAs, GaSb, AlN, AlP, AlAs, AlSb, InN, InP, InAs, InSb, or the like, a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or the like, a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or the like, or any combination thereof. The Group III-V semiconductor compound may further include a Group II element. Examples of the Group III-V semiconductor compound further including a Group II element may include InZnP, InGaZnP, InAlZnP, or the like. However, the embodiments are not limited thereto.

Examples of the Group III-VI semiconductor compound may include a binary compound such as GaS, GaSe, $Ga_2Se_3$, GaTe, InS, InSe, $In_2S_3$, $In_2Se_3$, InTe, or the like, a ternary compound such as AgInS, $AgInS_2$, CuInS, $CuInS_2$, $InGaS_3$, $InGaSe_3$, or the like, or any combination thereof. However, the embodiments are not limited thereto.

Examples of the Group I-III-VI semiconductor compound may include a ternary compound such as AgInS, $AgInS_2$, CuInS, $CuInS_2$, $CuGaO_2$, $AgGaO_2$, $AgAlO_2$, or the like, or any combination thereof. However, the embodiments are not limited thereto.

Examples of the Group IV-IV semiconductor compound may include a binary compound such as SnS, SnSe, SnTe, PbS, PbSe, PbTe, or the like, a ternary compound such as SnSeS, SnSeTe, SnSTe, PbSeS, PbSeTe, PbSTe, SnPbS, SnPbSe, SnPbTe, or the like, a quaternary compound such as SnPbSSe, SnPbSeTe, SnPbSTe, or the like, or any combination thereof. However, the embodiments are not limited thereto.

Examples of the Group IV element or compound may include a single-element compound such as Si, Ge, or the like, a binary compound such as SiC, SiGe, or the like, or any combination thereof. However, the embodiments are not limited thereto.

Each element included in a multi-element compound such as a binary compound, a ternary compound, and a quaternary compound may exist in a particle in a uniform concentration or in a non-uniform concentration.

The quantum dot may have a single structure or a core-shell double structure in which the concentration of each element included in the quantum dot may be uniform. For example, a material included in the core and a material included in the shell may be different from each other. The shell of the quantum dot may function as a protective layer preventing chemical modification of the core to maintain semiconductor characteristics and/or may function as a charging layer for imparting electrophoretic characteristics to the quantum dot. The shell may include a single layer or a multilayer. An interface between the core and the shell may have a concentration gradient where a concentration of elements in the shell decreases toward the center of the interface.

Examples of the shell of the quantum dot may include an oxide of a metal or a nonmetal, a semiconductor compound, any combination thereof, or the like. Examples of the metal or nonmetal oxide may include a binary compound such as $SiO_2$, $Al_2O_3$, $TiO_2$, ZnO, $ZnO_2$, MnO, $Mn_2O_3$, $Mn_3O_4$, CuO, FeO, $Fe_2O_3$, $Fe_3O_4$, CoO, $Co_3O_4$, NiO, or the like, a ternary compound such as $MgAl_2O_4$, $CoFe_2O_4$, $NiFe_2O_4$, $CoMn_2O_4$, the like, or any combination thereof. Examples of the semiconductor compound may include, as described above, the Group III-VI semiconductor compound, the Group II-VI semiconductor compound, the Group III-V semiconductor compound, the Group III-VI semiconductor compound, the Group I-III-VI semiconductor compound, the Group IV-VI semiconductor compound, or any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof. However, the embodiments are not limited thereto.

The quantum dot may have a full width of half maximum (FWHM) of an emission wavelength spectrum in a range of about 45 nm or less, particularly about 40 nm or less, or more particularly about 30 nm or less. Color purity and color reproducibility may be improved in the above range. As light emitted through the quantum dot is emitted in all directions, a viewing angle of light may be improved.

The quantum dot may be in the form of a nanoparticle, a nanotube, a nanowire, a nanofiber, or a nano-platelet particle, which may be spherical, pyramidal, multi-arm or cubic.

Because an energy band gap may be adjusted by adjusting the size of the quantum dot, light in various wavelength bands may be obtained from an emission layer of the quantum dot. Accordingly, a light-emitting diode emitting light having different wavelengths may be implemented by using quantum dots of different sizes. The size of the quantum dots may be selected such that red, green and/or blue light is emitted. The size of the quantum dots may be configured to emit white light by combining various colors of light.

The second-color quantum dot layer 427 and the third-color quantum dot layer 437 may also include a scattering body. Also, any material may be used as a resin included in the second-color quantum dot layer 427 and the third-color quantum dot layer 437 as long as it has excellent dispersion characteristics with respect to the scattering body and transmits light. For example, a polymer resin, such as acrylic, BCB, or HMDSO, may be used as a resin included in the second-color quantum dot layer 427 and the third-color quantum dot layer 437.

The scattering body included in the second-color quantum dot layer 427 and the third-color quantum dot layer 437 may be a particle having a different refractive index from that of a transparent resin included in the second-color quantum dot layer 427 and the third-color quantum dot layer 437, for example, a light scattering body. The scattering body is not particularly limited as long as it is a material capable of partially scattering transmitted light by forming an optical interface between the scattering body and the transparent resin. The scattering body may be, for example, a metal oxide particle, an organic particle, or the like. Examples of the metal oxide for scattering may include titanium oxide ($TiO_2$), zirconium oxide ($ZrO_2$), aluminum oxide ($Al_2O_3$), indium oxide ($In_2O_3$), zinc oxide ($ZnO$ or $ZnO_2$), tin oxide ($SnO_2$), or the like, and examples of the organic material for scattering may include an acrylic resin, a urethane resin, or the like. The scattering body may scatter light in multiple directions irrespective of an angle of incidence without substantially converting a wavelength of incident light. Accordingly, the scattering body may improve the side surface visibility of the display device. The scattering body included in the second-color quantum dot layer 427 and the third-color quantum dot layer 437 may increase light conversion efficiency by increasing a probability that incident light incident on the second-color quantum dot layer 427 and the third-color quantum dot layer 437 meets the quantum dots.

In an embodiment, the second-color quantum dot layer 427 may be disposed between the second-color color filter layer 423 and the opposite electrode 305. Because the second-color color filter layer 423 allows light in a second wavelength band to pass through, light in a first wavelength band generated by the intermediate layer 303 may be required to be converted into light in the second wavelength band in the second-color quantum dot layer 427 before being incident on the second-color color filter layer 423 which allows the light in the second wavelength band to pass through. For a same reason, the third-color quantum dot layer 437 may be disposed between the third-color color filter layer 433 and the opposite electrode 305. Accordingly, the first-color color filter layer 413 may contact the first bottom surface 410*a* of the first groove 410, the second-color color filter layer 423 may contact the second bottom surface 420*a* of the second groove 420, and the third-color color filter layer 433 may contact the third bottom surface 430*a* of the third groove 430.

The first pixel PX1 may emit light having a wavelength in a first wavelength band generated by the intermediate layer 303 to the outside without wavelength conversion. Accordingly, the first pixel PX1 may not have a quantum dot layer. Because the quantum dot layer is not required in the first groove 410 as described above, a transparent layer 417 including a transparent resin may be in the first groove 410. The transparent layer 417 may include, for example, acryl, BCB, or HMDSO. In some embodiments, the transparent layer 417 may also not exist in the first groove 410 unlike that shown in FIG. 1.

In the display apparatus according to the embodiment, light in the first wavelength band may be emitted from the first pixel PX1 to the outside, light in the second wavelength band may be emitted from the second pixel PX2 to the outside, and light in the third wavelength band may be emitted from the third pixel PX3 to the outside. Accordingly, the display apparatus according to the embodiment may display a full-color image.

In a manufacturing operation of the display apparatus, after forming the first groove 410 to the third groove 430 in the upper substrate 400, the first-color color filter layer 413 to the third-color color filter layer 433 are positioned in the first groove 410 to the third groove 430, respectively. Therefore, materials used in an operation of forming the first-color color filter layer 413 to the third-color color filter layer 433 may be prevented from being mixed with each other. For example, in case that the first-color color filter layer 413 has been formed and the second-color color filter layer 423 is being formed, in a display apparatus in the related art, a material used to form the first-color color filter layer 413 and a material used to form the second-color color filter layer 423 may be mixed. However, in a display apparatus according to the embodiment, because the first-color color filter layer 413 to the third-color color filter layer 433 are respectively positioned in the first groove 410 to the third groove 430, materials for forming the first-color color filter layer 413 to the third-color color filter layer 433 may be prevented from being mixed with each other.

In the embodiment of a display apparatus in the related art, before forming a first-color color filter layer and a second-color color filter layer, it may be considered to form a barrier layer in a space therebetween. However, a manufacturing operation may become complicated, for example, a first barrier layer may need to be formed and a second barrier layer may need to be formed on the first barrier layer to form the barrier layer having a sufficient height. However, in the display apparatus according to the embodiment, because there is no operation of forming such a barrier layer in a manufacturing operation, the manufacturing operation may be simplified, and a defect rate may be reduced.

Similarly, in the display apparatus according to the embodiment, as described above, the second-color quantum dot layer 427 and the third-color quantum dot layer 437 are also positioned in the second groove 420 and the third groove 430, respectively. Accordingly, the above descriptions of the first-color color filter layer 413 to the third-color color filter layer 433 may also be applied to the second-color quantum dot layer 427 and the third-color quantum dot layer 437. For example, in the embodiment of the display apparatus according to the embodiment, materials used in operations of forming the second-color quantum dot layer 427 and the third-color quantum dot layer 437 in a manufacturing operation of the display apparatus may be effectively prevented from being mixed with each other.

In case that a low-refractive-index layer is integral in pixels to correspond to an entire surface of the upper substrate 400, for example, damage to a first-color emission layer included in the intermediate layer 303 may occur due to outgas generated in the low-refractive-index layer during a manufacturing operation of the display apparatus or during use after manufacturing. Shrinkage of the low-refractive-index layer may occur during the manufacturing operation of the display apparatus or during use after manufacturing, and peeling of upper or lower layers may occur.

However, in the display apparatus according to the embodiment, as described above, the first low-refractive-index layer 415, the second low-refractive-index layer 425, and the third low-refractive-index layer 435 may be located in the first groove 410 to the third groove 430, respectively. Accordingly, a volume of a low-refractive-index layer in the entire display apparatus may be reduced, and thus, an amount of outgas generated in the low-refractive-index layer may also be reduced. Because the first low-refractive-index layer 415, the second low-refractive-index layer 425, and the third low-refractive-index layer 435 are located in the first groove 410 to the third groove 430, even in case that the first low-refractive-index layer 415, the second low-refractive-index layer 425 and/or the third low-refractive-index layer 435 shrinks, a problem may not occur except for a corresponding pixel.

When a low-refractive-index layer is integral as a single body in pixels to correspond to an entire surface of the upper substrate 400, impurities, such as moisture from the outside, may move along the integral low-refractive-index layer to cause defects in various pixels. Because a resin having hollow silicas generally has a high water absorption rate, the above problem may be worsened in case that an integral low-refractive-index layer including the resin having hollow silicas is formed. However, in the display apparatus according to the embodiment, as described above, the first low-refractive-index layer 415, the second low-refractive-index layer 425, and the third low-refractive-index layer 435 may be spaced apart from each other and positioned in the first groove 410 to the third groove 430, respectively. Accordingly, the above problem may be effectively prevented from occurring.

The first low-refractive-index layer 415 may be disposed between the first-color color filter layer 413 and the transparent layer 417 or a first light-emitting element, the second low-refractive-index layer 425 may be disposed between the second-color color filter layer 423 and the second-color quantum dot layer 427, and the third low-refractive-index layer 435 may be disposed between the third-color color filter layer 433 and the third-color quantum dot layer 437. In the embodiment of the optical resonance using a low-refractive-index layer described above, a distance between components generating the optical resonance may vary depending on a wavelength of light to be optically resonated. For example, a distance between an interface between the second low-refractive-index layer 425 and the second protective layer 407 and the second pixel electrode 321 may be different from a distance between an interface between the third low-refractive-index layer 435 and the second protective layer 407 and the third pixel electrode 331. Accordingly, the second low-refractive-index layer 425 is disposed between the second-color color filter layer 423 and the second-color quantum dot layer 427, the third low-refractive-index layer 435 is disposed between the third-color color filter layer 433 and the third-color quantum dot layer 437, and the second low-refractive-index layer 425 and the third low-refractive-index layer 435 may be formed to have different thicknesses, and thus, a necessary optical resonance distance according to a wavelength of light to be resonated may be secured.

It is necessary to prevent the second-color quantum dot layer 427 and the third-color quantum dot layer 437 from being damaged during a manufacturing operation of such a display apparatus or a use operation thereof after manufacturing. For example, in case that quantum dots in the second-color quantum dot layer 427 are damaged due to outgas generated in the second-color color filter layer 423, the quantum dots may not be able to convert light in a first wavelength band into light in a second wavelength band. Accordingly, preventing the quantum dots in the second-color quantum dot layer 427 from being damaged by the outgas generated in the second-color color filter layer 423 may be needed. Similarly, in case that quantum dots in the third-color quantum dot layer 437 are damaged due to outgas generated in the third-color color filter layer 433, the quantum dots may not be able to convert light in the first wavelength band into light in a third wavelength band. Accordingly, preventing the quantum dots in the third-color quantum dot layer 437 from being damaged by the outgas generated in the third-color color filter layer 433 may be needed. To this end, a first protective layer 405 may be disposed between the second-color color filter layer 423 and the second-color quantum dot layer 427, and may also be disposed between the third-color color filter layer 433 and the third-color quantum dot layer 437. The first protective layer 405 may prevent gas from passing therethrough by including an inorganic material such as silicon oxide, silicon nitride, silicon oxynitride, or aluminum oxide. The first protective layer 405 may be integral as a single body over the entire surface of the upper substrate 400. Accordingly, the first protective layer 405 may be disposed between the first-color color filter layer 413 and the transparent layer 417 in the first groove 410 of the upper substrate 400.

Because the first protective layer 405 includes an inorganic material, the first protective layer 405 may have a shape corresponding to a surface therebelow when formed. Accordingly, as shown in FIG. 1, the first protective layer 405 may be formed flat on a portion of the reflective layer 403 outside the first groove 410 to the third groove 430 of the upper substrate 400, and may be formed along the reflective layer 403 in the first groove 410 to the third groove 430 and may contact the first-color color filter layer 413 to the third-color color filter layer 433. An operation of forming the first protective layer 405 is described below.

Similarly, in case that quantum dots in the second-color quantum dot layer 427 are damaged due to outgas generated in the second low-refractive-index layer 425, the quantum dots may not be able to convert light in the first wavelength band into light in the second wavelength band. Accordingly, preventing the quantum dots in the second-color quantum dot layer 427 from being damaged by the outgas generated in the second low-refractive-index layer 425 may be needed. Similarly, in case that quantum dots in the third-color quantum dot layer 437 are damaged due to outgas generated in the third low-refractive-index layer 435, the quantum dots may not be able to convert light in the first wavelength band into light in the third wavelength band. Accordingly, preventing the quantum dots in the third-color quantum dot layer 437 from being damaged by the outgas generated in the third low-refractive-index layer 435 may be needed. To this end, the second protective layer 407 may be disposed between the second low-refractive-index layer 425 and the second-color quantum dot layer 427, and may also be disposed between the third low-refractive-index layer 435 and the third-color quantum dot layer 437. The second protective layer 407 may prevent gas from passing therethrough by including an inorganic material such as silicon oxide, silicon nitride, silicon oxynitride, or aluminum oxide. The second protective layer 407 may be integral as a single body over the entire surface of the upper substrate 400. Accordingly, the second protective layer 407 may be located between the first low-refractive-index layer 415 and the transparent layer 417 in the first groove 410 of the upper substrate 400.

Because the second protective layer 407 includes an inorganic material, the second protective layer 407 has a shape corresponding to a surface therebelow when formed. Accordingly, as shown in FIG. 1, the second protective layer 407 may be formed flat on portions of the reflective layer 403 and the first protective layer 405, the portions being outside the first groove 410 to the third groove 430 of the upper substrate 400, and may be formed along the reflective layer 403 and the first protective layer 405 in the first groove 410 to the third groove 430 and may contact the first low-refractive-index layer 415 to the third low-refractive-index layer 435. An operation of forming the second protective layer 407 is described below.

The intermediate layer 303 of an organic light-emitting device may be very vulnerable to impurities, such as moisture or oxygen from the outside. Therefore, it is necessary to prevent outgas generated in the second-color quantum dot layer 427 and the third-color quantum dot layer 437 from proceeding in a direction to the intermediate layer 303 in a manufacturing operation of the display apparatus or use operation after the manufacturing. To this end, a third protective layer 409 may be disposed between the second-color quantum dot layer 427 and the opposite electrode 305, and may also be disposed between the third-color quantum dot layer 437 and the opposite electrode 305. The third protective layer 409 may prevent gas from passing therethrough by including an inorganic material such as silicon oxide, silicon nitride, silicon oxynitride, or aluminum oxide. The third protective layer 409 may be integral as a single body over the entire surface of the upper substrate 400. Accordingly, the third protective layer 409 may contact the transparent layer 417 in the first groove 410 of the upper substrate 400, contact the second-color quantum dot layer 427 in the second groove 420, and contact the third-color quantum dot layer 437 in the third groove 430. Also, the third protective layer 409 may contact the second protective layer 407 on a portion of the lower surface 400*b* of the upper substrate 400, the portion being outside the first groove 410 to the third groove 430.

FIGS. 2 to 10 are cross-sectional views or plan views, schematically illustrating an operation of manufacturing a portion of the display apparatus of FIG. 1. FIGS. 2 to 10 are cross-sectional views or plan views, schematically illustrating operations of manufacturing the upper substrate 400, the first-color color filter layer 413 to the third-color color filter layer 433, the first low-refractive-index layer 415 to the third low-refractive-index layer 435, the second-color quantum dot layer 427, the third-color quantum dot layer 437, the first protective layer 405, the second protective layer 407, and the third protective layer 409 of the display apparatus of FIG. 1.

Figure 2:
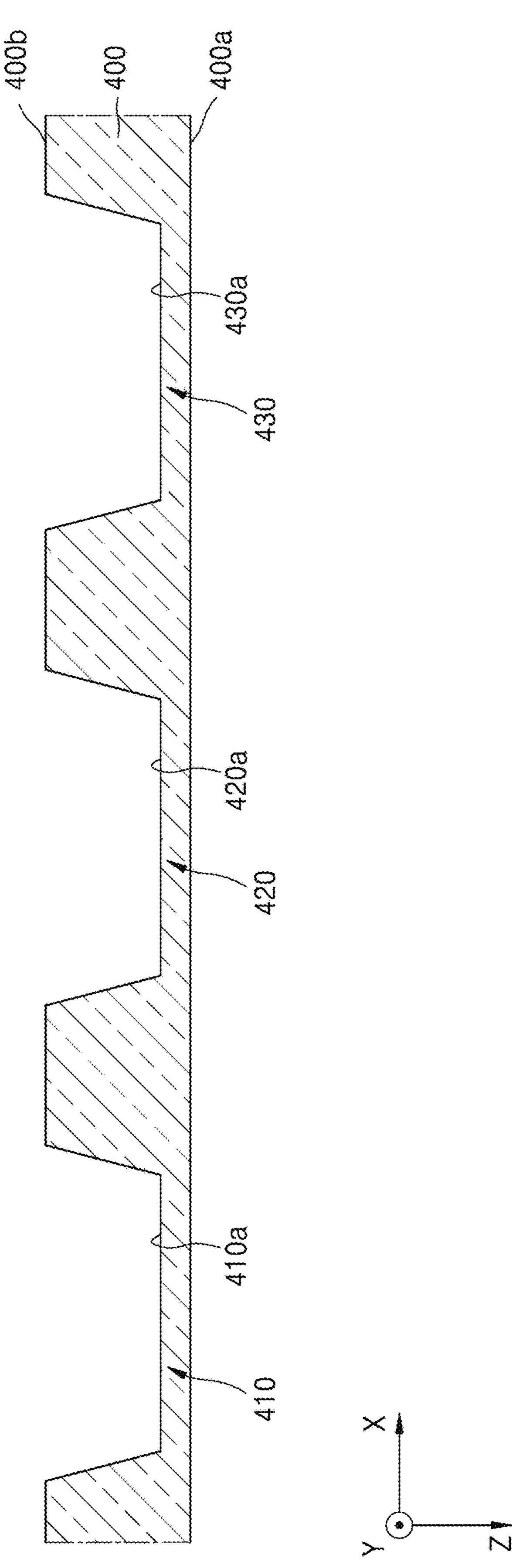
FIGS. 2 to 10 are cross-sectional views or plan views, schematically illustrating an operation of manufacturing a portion of the display apparatus of FIG. 1.
Figure 3:
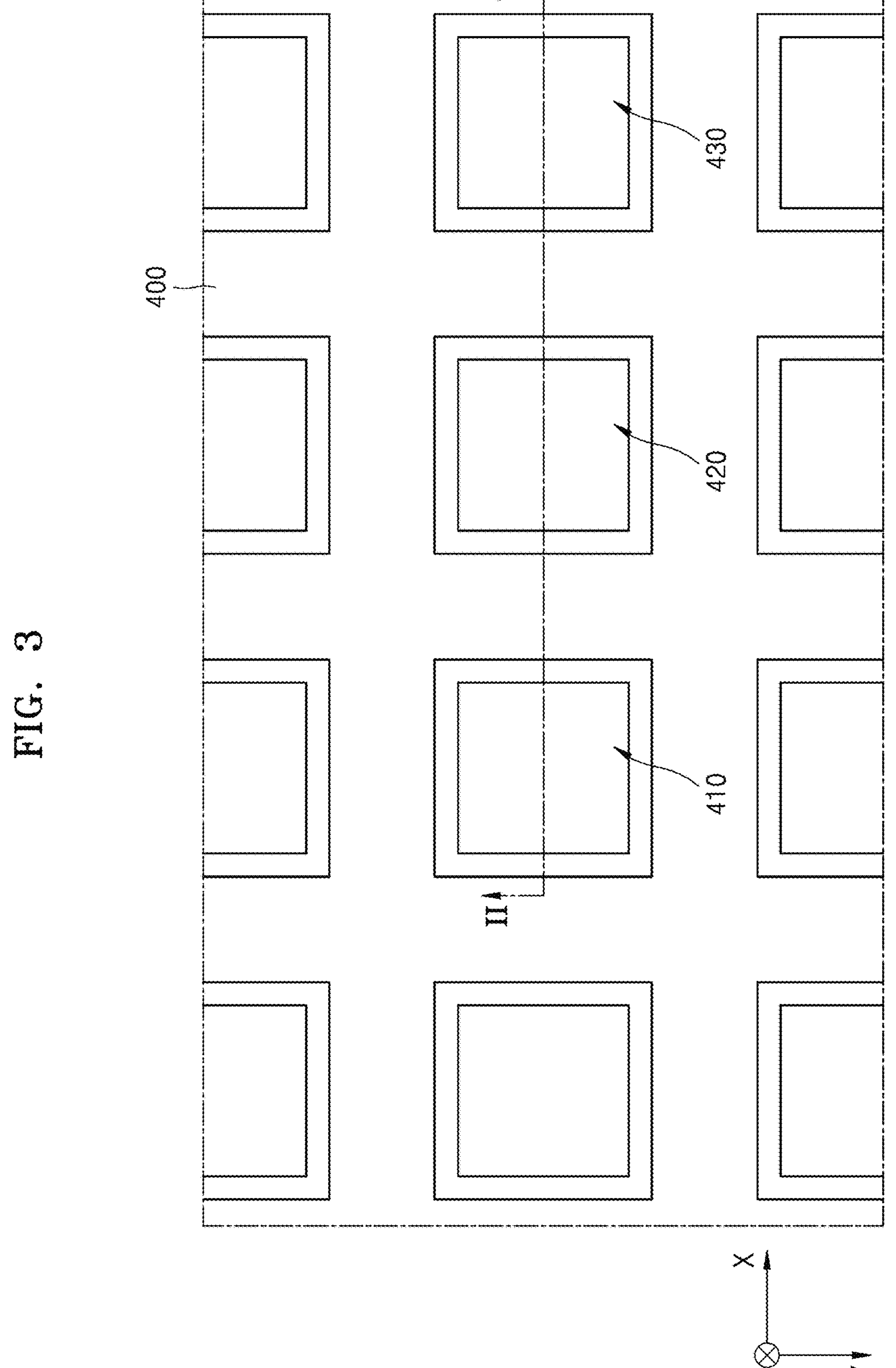

First, as shown in FIGS. 2 and 3, the first groove 410 to the third groove 430 are formed in the lower surface 400*b* of the upper substrate 400 in a −Z direction. FIG. 2 is a plan view, which is a cross-section taken along line II-II of FIG. 3. The first groove 410 to the third groove 430 may each be formed by wet etching using a photoresist. Because the first groove 410 to the third groove 430 are each be formed by wet etching, an inner side surface of each of the first groove 410 to the third groove 430 is inclined with respect to the lower surface 400*b* of the upper substrate 400. As such, the reflective layer 403 to be formed later may be formed on the inner side surface of each of the first groove 410 to the third groove 430 without defects. At this time, an area of a cross-section of each of the first groove 410 to the third groove 430 by a virtual plane (XY plane) parallel to the lower surface 400*b* of the upper substrate 400 may decrease from the lower surface 400*b* to the upper surface 400*a* of the upper substrate 400.

In case that the upper substrate 400 includes a polymer resin such as polyimide or the like, a material for forming the upper substrate 400 may also have photoresist properties. In case that the material for forming the upper substrate 400 is coated on a carrier substrate, only a particular portion thereof may be exposed and developed, and the first groove 410 to the third groove 430 each having a shape as shown in FIGS. 2 and 3 may be formed. Thereafter, the upper substrate 400 having a shape as shown in FIGS. 2 and 3 may be formed by performing curing by using a method in which a structure in which the first groove 410 to the third groove 430 are formed is irradiated and cured with ultraviolet (UV) light. The carrier substrate may be removed.

Figure 4:
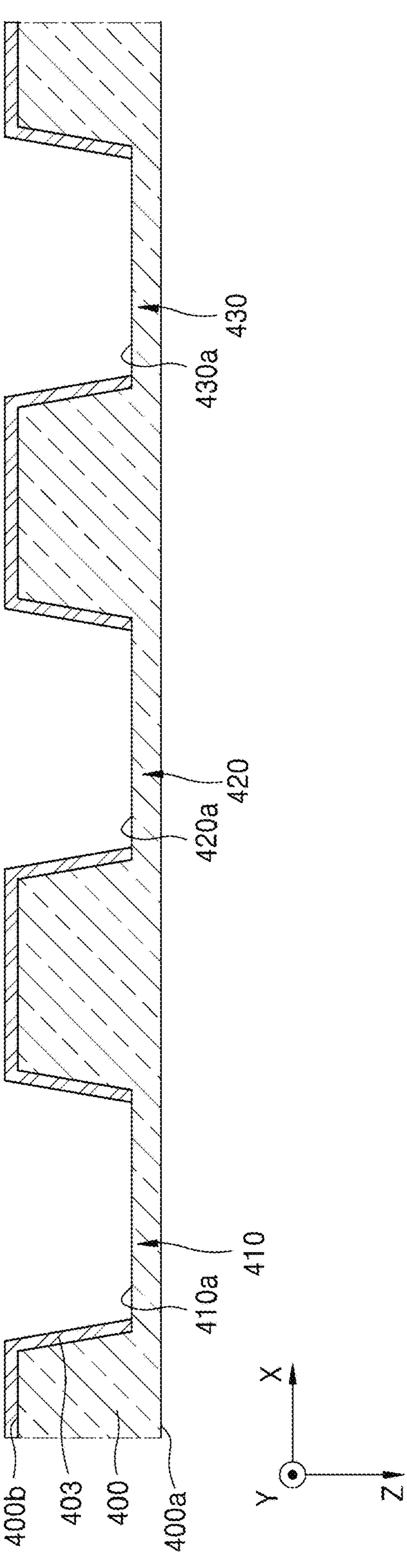

As shown in FIG. 4, the reflective layer 403 may be formed on an inner side surface of each of the first groove 410 to the third groove 430 of the upper substrate 400. A metal layer may be formed on the entire surface of the lower surface 400*b* of the upper substrate 400 by sputtering or the like, and portions of the metal layer on the bottom surfaces 410*a* to 430*a* of the first groove 410 to the third groove 430 are removed, and thus, the reflective layer 403 as shown in FIG. 4 may be formed. The portions of the metal layer on the bottom surfaces 410*a* to 430*a* of the first groove 410 to the third groove 430 may be removed by using a dry etching method using a photoresist. For example, a photoresist may be formed on the metal layer formed on the entire surface of the lower surface 400*b* of the upper substrate 400, and exposure and development are performed to remove the photoresist only on portions of the metal layer on the bottom surfaces 410*a* to 430*a* of the first groove 410 to the third groove 430. Thereafter, portions of the metal layer on the bottom surfaces 410*a* to 430*a* of the first groove 410 to the third groove 430 may be removed through dry etching. An operation of removing a photoresist remaining on the reflective layer 403 may be also performed.

As described above, because the inner side surface of each of the first groove 410 to the third groove 430 is inclined with respect to the lower surface 400*b* of the upper substrate 400, the reflective layer 403 may be formed on the inner side surface of each of the first groove 410 to the third groove 430 of the upper substrate 400. In case that a dry etching method was used when forming the first groove 410 to the third groove 430, the inner side surface of each of the first groove 410 to the third groove 430 may be substantially perpendicular to the lower surface 400*b* of the upper substrate 400, and accordingly, in case that a metal layer is formed on the entire surface of the lower surface 400*b* of the upper substrate 400, a defect that the metal layer is not formed on the inner side surface of each of the first groove 410 to the third groove 430 may occur.

Figure 5:
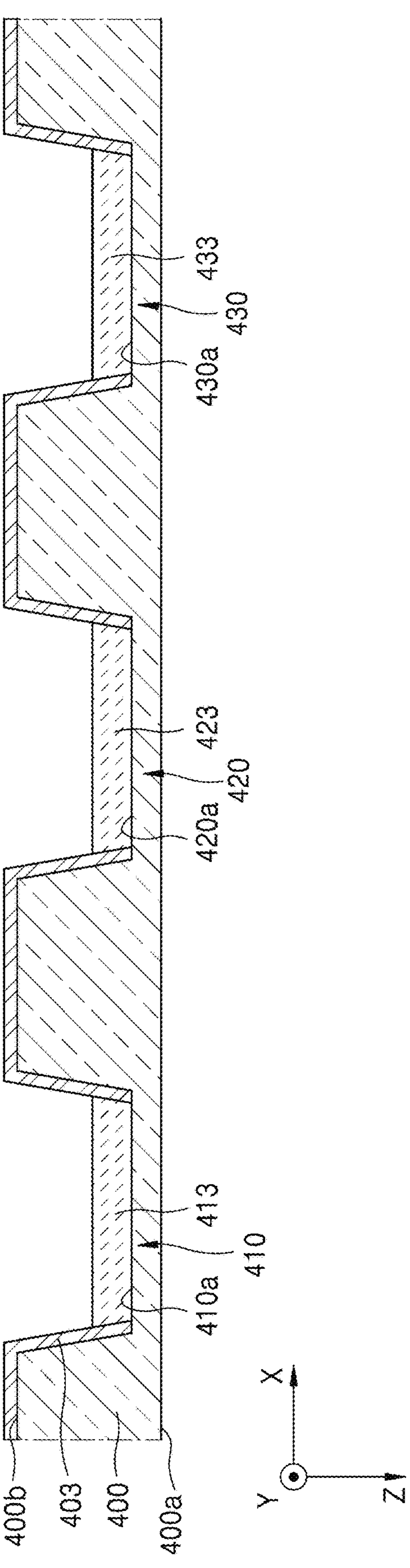

Thereafter, as shown in FIG. 5, through an inkjet printing method, the first-color color filter layer 413 may be formed in the first groove 410, the second-color color filter layer 423 may be formed in the second groove 420, and the third-color color filter layer 433 may be formed in the third groove 430. Because the inkjet printing method is used, an amount that a material for forming a color filter layer is wasted may be minimized. Because the first-color color filter layer 413 to the third-color color filter layer 433 are located in the first groove 410 to the third groove 430, respectively, materials used in an operation of forming the first-color color filter layer 413 to the third-color color filter layer 433 may be effectively prevented from being mixed with each other.

Figure 6:
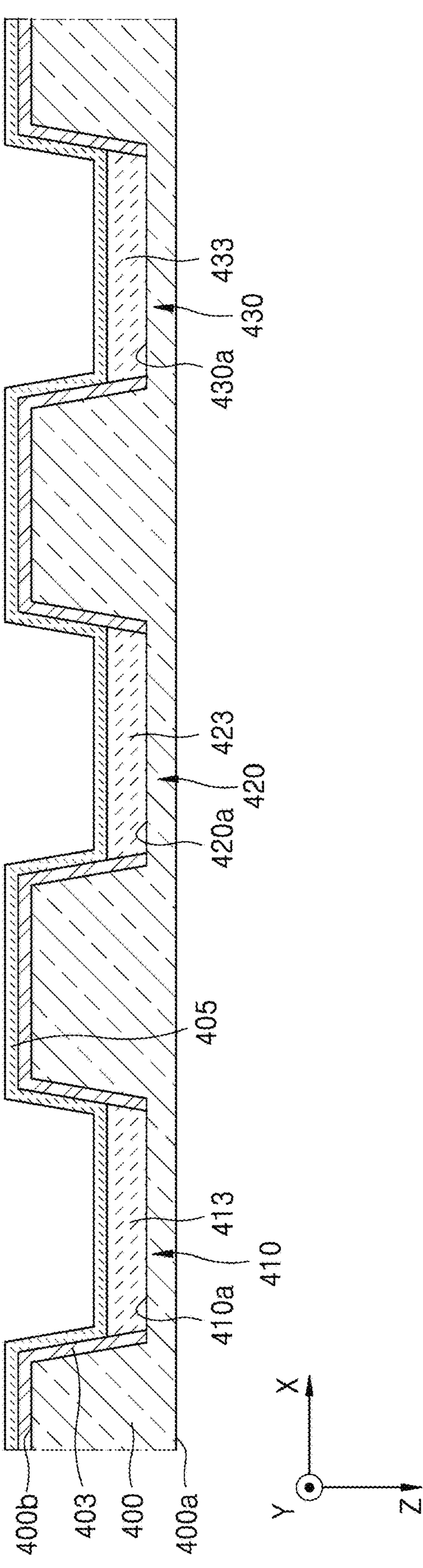

As shown in FIG. 6, the first protective layer 405 is formed by using silicon oxide, silicon nitride, silicon oxynitride, or aluminum oxide to correspond to the entire surface of the lower surface 400*b* of the upper substrate 400. Accordingly, the first protective layer 405 may contact the first-color color filter layer 413 to the third-color color filter layer 433, and may also contact the reflective layer 403 on the inner side surface of each of the first groove 410 to the third groove 430. Because the reflective layer 403 is also present on a portion of the lower surface 400*b* of the upper substrate 400, the portion being outside the first groove 410 to the third groove 430, the first protective layer 405 may also contact the reflective layer 403 at the portion. The first protective layer 405 may be formed by a CVD deposition method. At this time, a low-temperature CVD deposition method of about 200° C. or less may be used such that the first-color color filter layer 413 to the third-color color filter layer 433, which are previously formed, are not damaged.

Figure 7:
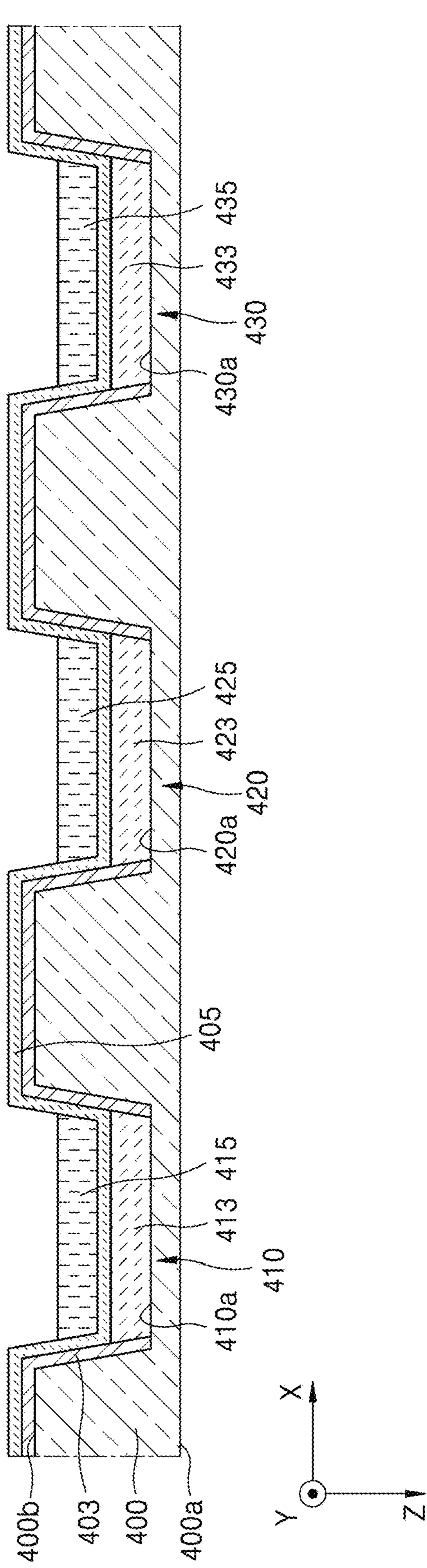

After the first protective layer 405 is formed, as shown in FIG. 7, the first low-refractive-index layer 415 is formed in the first groove 410, the second low-refractive-index layer 425 is formed in the second groove 420, and the third low-refractive-index layer 435 is formed in the third groove 430. Because an inkjet printing method is used, an amount that a material for forming a low-refractive-index layer is wasted may be minimized. As described above, an amount of outgas generated in a low-refractive-index layer during a manufacturing operation of a display apparatus or a use operation after manufacturing may be remarkably reduced.

Figure 8:
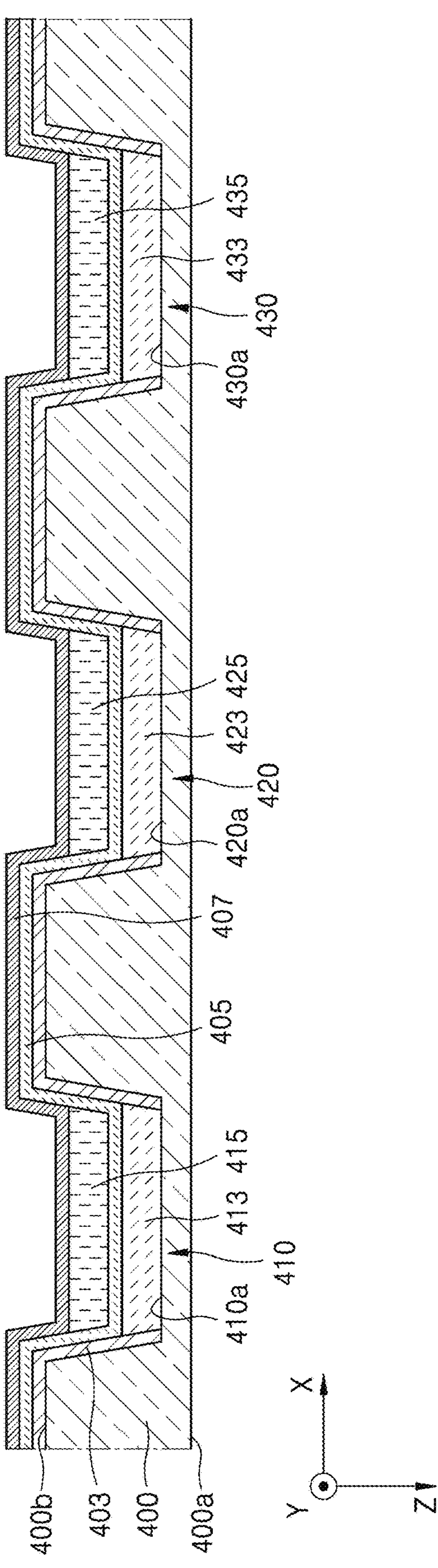

As shown in FIG. 8, the second protective layer 407 is formed by using silicon oxide, silicon nitride, silicon oxynitride, or aluminum oxide to correspond to the entire surface of the lower surface 400*b* of the upper substrate 400. Accordingly, the second protective layer 407 may contact the first low-refractive-index layer 415 to the third low-refractive-index layer 435, and may also contact the first protective layer 405 on the inner side surface of each of the first groove 410 to the third groove 430. Because the first protective layer 405 is also present on a portion of the lower surface 400*b* of the upper substrate 400, the portion being outside the first groove 410 to the third groove 430, the second protective layer 407 may also contact the first protective layer 405 at the portion. The second protective layer 407 may be formed by a CVD deposition method. At this time, a low-temperature CVD deposition method of about 200° C. or less may be used such that the first-color color filter layer 413 to the third-color color filter layer 433, which may be previously formed, may be not damaged.

Figure 9:
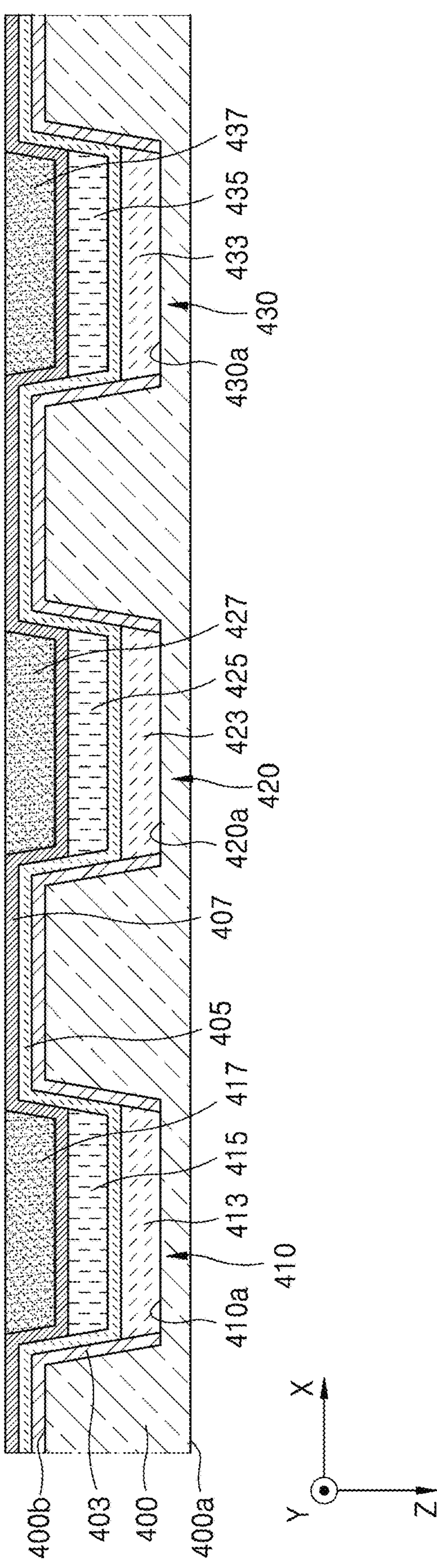

After the second protective layer 407 is formed, as shown in FIG. 9, the second-color quantum dot layer 427 may be formed in the second groove 420, and the third-color quantum dot layer 437 is formed in the third groove 430. Because an inkjet printing method is used, an amount that a material for forming a quantum dot layer is wasted may be minimized. Because the second-color quantum dot layer 427 and the third-color quantum dot layer 437 are respectively in the second groove 420 and the third groove 430, materials used in an operation of forming the second-color quantum dot layer 427 and the third-color quantum dot layer 437 may be effectively prevented from being mixed with each other. In an embodiment, if necessary, the transparent layer 417 may be formed above the first protective layer 405 in the first groove 410.

Figure 10:
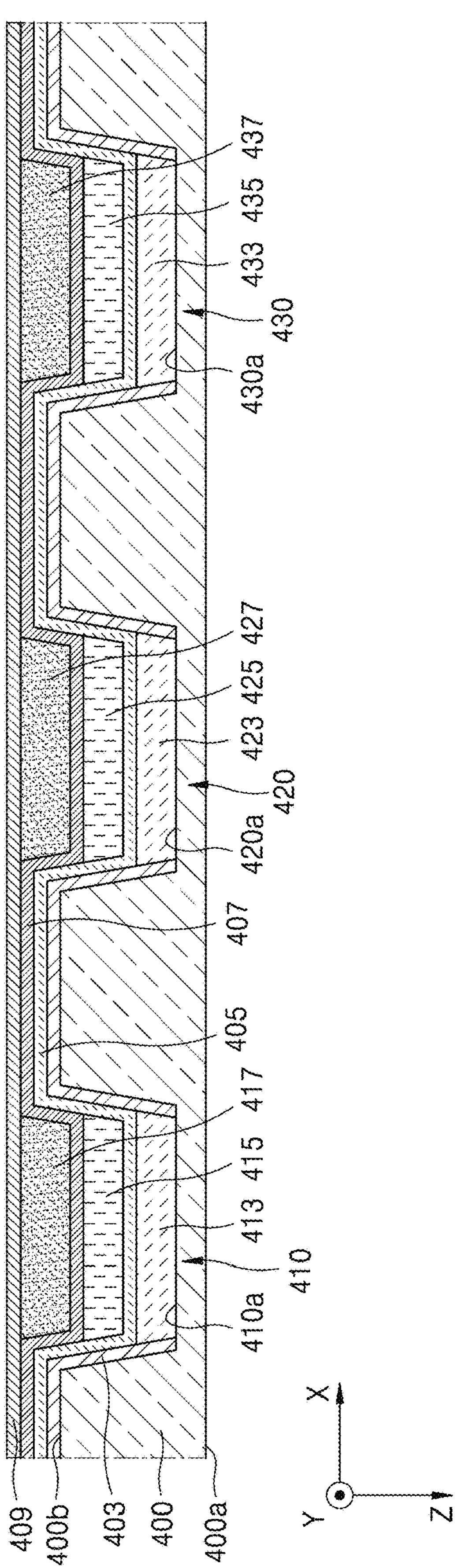

As shown in FIG. 10, the third protective layer 409 may be formed by using silicon oxide, silicon nitride, silicon oxynitride, or aluminum oxide to correspond to the entire surface of the lower surface 400*b* of the upper substrate 400. Accordingly, the third protective layer 409 may contact the second-color quantum dot layer 427 and the third-color quantum dot layer 437, and also contact the second protective layer 407 outside the first groove 410 to the third groove 430. The third protective layer 409 may be formed by a CVD deposition method. At this time, a low-temperature CVD deposition method of about 200° C. or less may be used such that the first-color color filter layer 413 to the third-color color filter layer 433 and/or the second-color quantum dot layer 427 and the third-color quantum dot layer 437, which may be previously formed, may be not damaged.

As described above, after the upper substrate 400, the first-color color filter layer 413 to the third-color color filter layer 433, the first low-refractive-index layer 415 to the third low-refractive-index layer 435, the second-color quantum dot layer 427, the third-color quantum dot layer 437, the first protective layer 405, the second protective layer 407, the third protective layer 409, or the like may be formed, the upper substrate 400 and the lower substrate 100 may be bonded to manufacture a display apparatus as shown in FIG. 1. Prior to the above, through a separate operation, the first thin-film transistor 210 to the third thin-film transistor 230, the first pixel electrode 311 to the third pixel electrode 331, the intermediate layer 303, and the opposite electrode 305 may be formed on the lower substrate 100.

In an embodiment, the lower substrate 100 bonding to the upper substrate 400 may mean that the lower substrate 100 and the upper substrate 400 may be bonded by a sealant by coating the sealant outside a display area. As another example, after a filler is positioned in a space between the lower substrate 100 and the upper substrate 400 as shown in FIG. 1, the lower substrate 100 may be bonded to the upper substrate 400 by the filler. The filler may be a transparent filler, which may include a transparent polymer resin, such as polyimide, epoxy, or the like.

Figure 11:
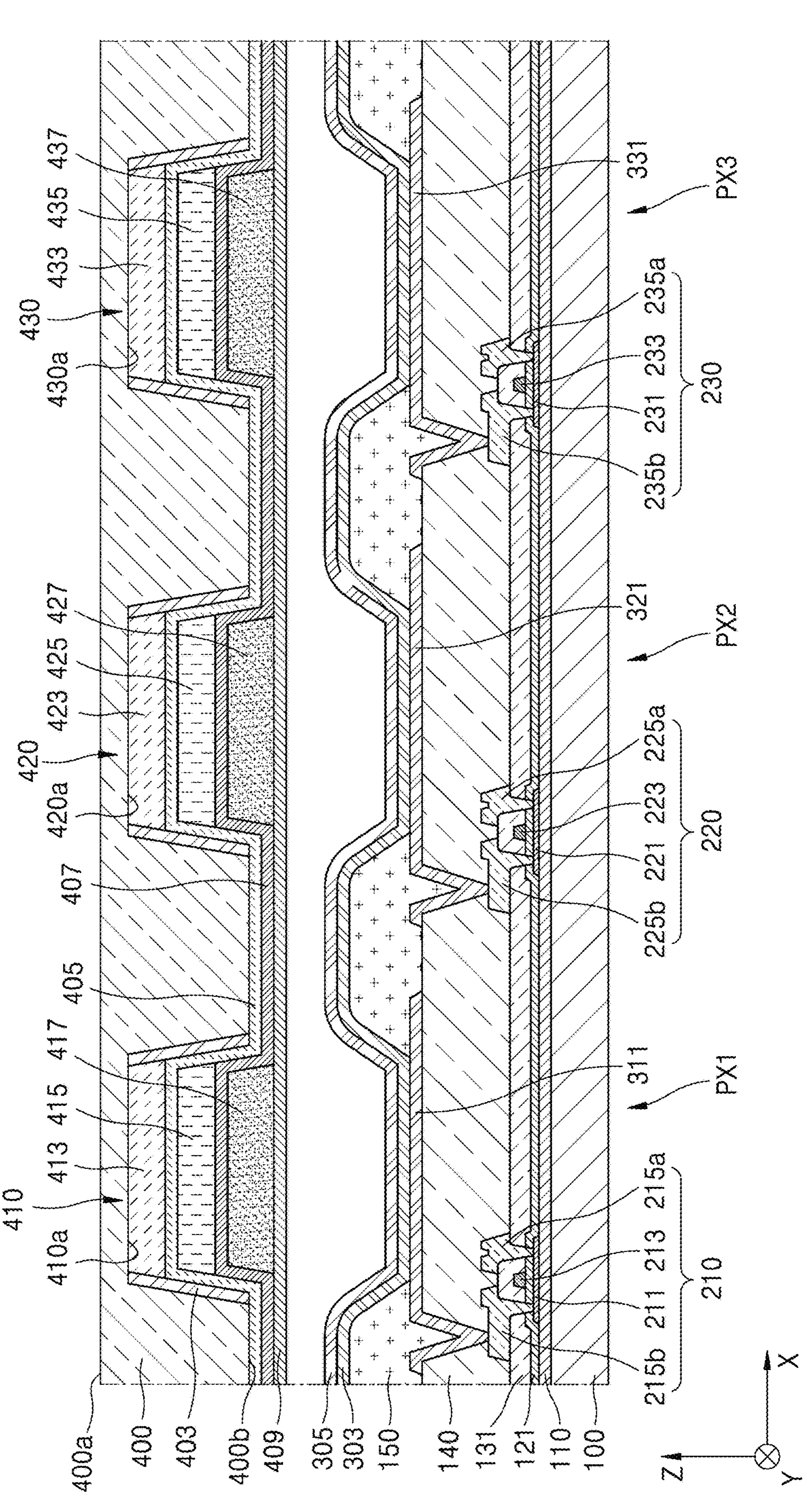
FIG. 11 is a cross-sectional view schematically illustrating a portion of a display apparatus according to an embodiment.

It has been described that the reflective layer 403 may be on an inner side surface of each of the first groove 410 to the third groove 430 of the upper substrate 400, and may be also present on a portion of the lower surface 400*b* of the upper substrate 400, the portion outside the first groove 410 to third groove 430. However, the disclosure is not limited thereto. For example, as shown in FIG. 11, which is a cross-sectional view schematically illustrating a portion of a display apparatus according to an embodiment, the reflective layer 403 may be present on the inner side surface of each of the first groove 410 to the third groove 430 of the upper substrate 400, and may also not exist on a portion of the lower surface 400*b* of the upper substrate 400, the portion being outside the first groove 410 to the third groove 430. The first protective layer 405 may contact the lower surface 400*b* of the upper substrate 400 in the portion outside the first groove 410 to the third groove 430.

Figure 12:
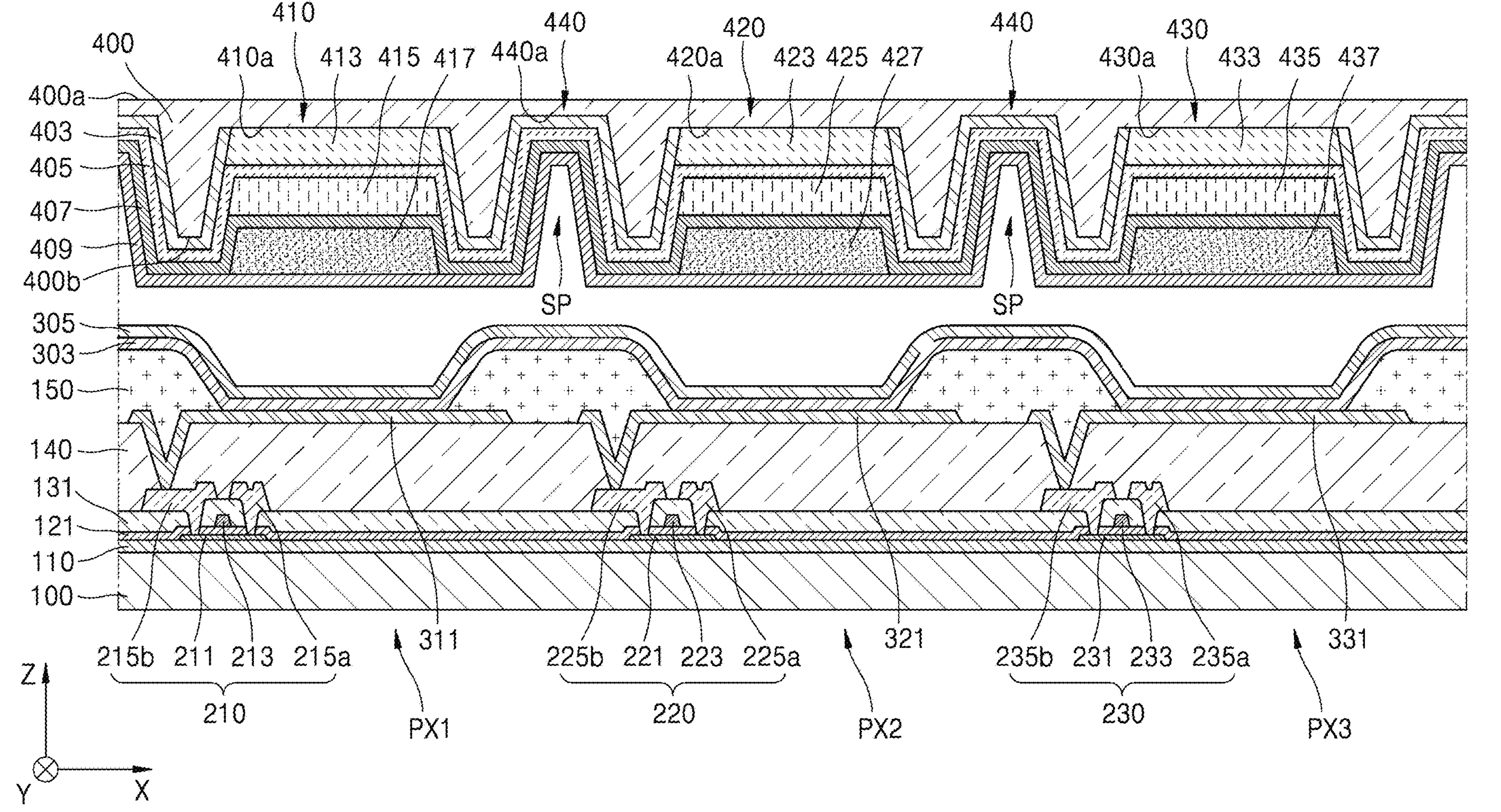
FIG. 12 is a cross-sectional view schematically illustrating a portion of a display apparatus according to an embodiment.

FIG. 12 is a cross-sectional view schematically illustrating a portion of a display apparatus according to an embodiment. As shown in FIG. 12, the upper substrate 400 may have an additional groove 440 on the lower surface 400*b* in a direction (−Z direction) of the lower substrate 100. The additional groove 440 may be located between the first groove 410 and the second groove 420, between the second groove 420 and the third groove 430, and also between the first groove 410 and the third groove 430.

Figure 13:
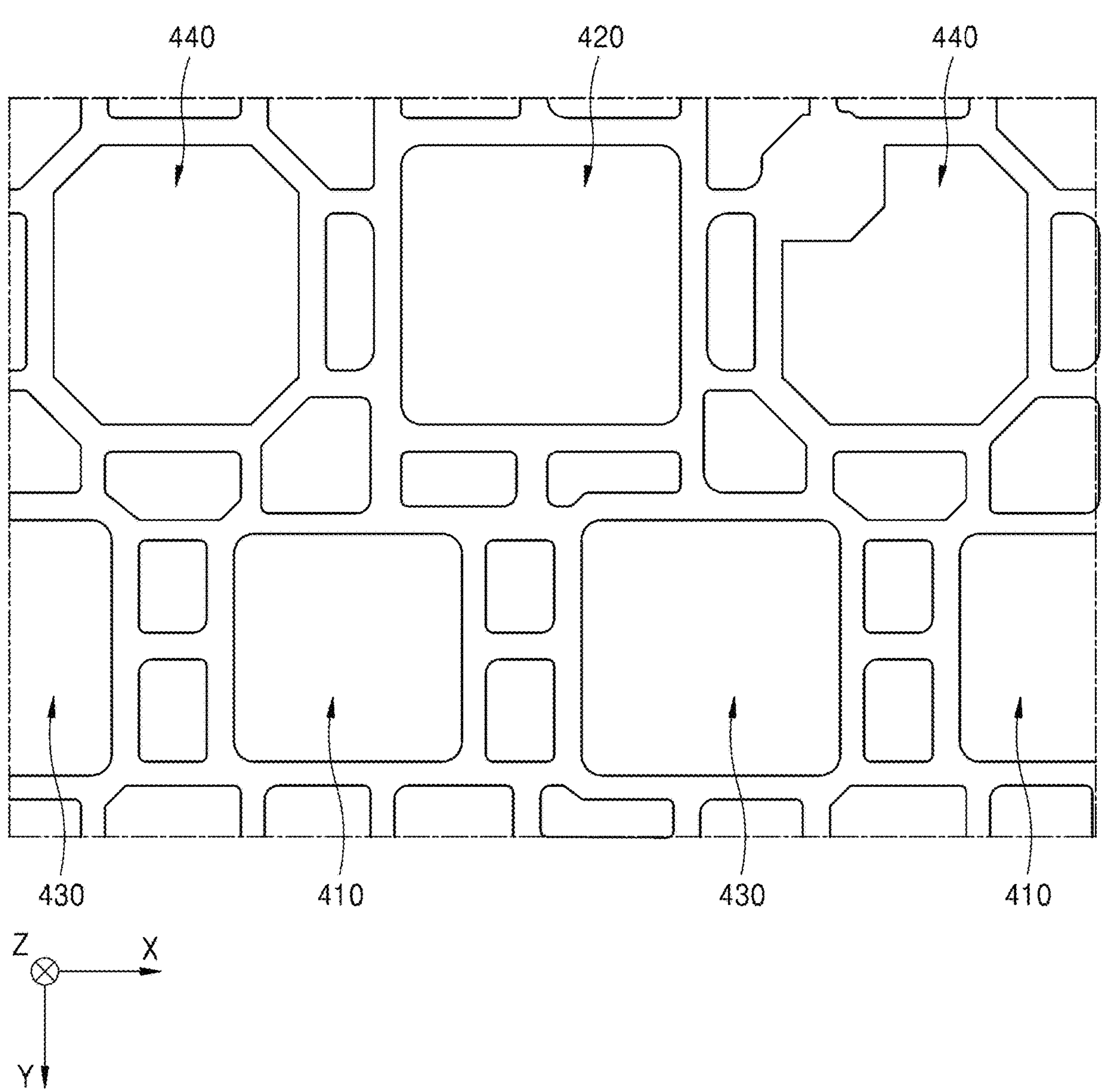
FIG. 13 is a plan view schematically illustrating a portion of a display apparatus according to an embodiment.

The relative positions of the first groove 410 to the third groove 430 and the additional groove 440 are not limited thereto. For example, as shown in FIG. 13, which may be a plan view schematically illustrating a portion of a display apparatus according to an embodiment, in particular, a plan view schematically illustrating the lower surface 400*b* of the upper substrate 400 of the display apparatus, the first groove 410 to the third groove 430 and the additional groove 440 may be disposed over the lower surface 400*b*. FIG. 13 illustrates that the first grooves 410 and the third grooves 430 are alternately positioned in a row (in an X-axis direction), and the second grooves 420 and the additional grooves 440 are alternately positioned in another row (in the X-axis direction). Also, small spaces divided by partitions may exist between the first grooves 410 to the thirds groove 430 and the additional grooves 440.

As shown in FIG. 12, the second protective layer 407 may contact the first protective layer 405 on a bottom surface 440*a* of the additional groove 440, and the third protective layer 409 may contact the second protective layer 407 on the bottom surface 440*a* of the additional groove 440. Because a color-filter layer or a quantum dot layer does not exist in the additional groove 440, a step-difference may be formed between a first portion which is a part of a surface of the third protective layer 409 in a direction (−Z direction) of the lower substrate 100 and may be over the bottom surface 440*a* (in a +Z direction) of the additional groove 440, and a second portion which is another part of the surface of the third protective layer 409 in the direction (−Z direction) of the lower substrate 100 and may be outside the first groove 410 to the third groove 430 and the additional groove 440. Accordingly, in the additional groove 440, a space SP corresponding to the additional groove 440 may be formed on a surface of the third protective layer 409 facing the lower substrate 100.

As described above, a display apparatus may be manufactured by bonding the upper substrate 400 to the lower substrate 100. In case that impurities exist between the upper substrate 400 and the lower substrate 100 during such a bonding operation, defects may accordingly occur. However, in the display apparatus according to the embodiment, even in case that impurities exist between the upper substrate 400 and the lower substrate 100 during the bonding operation, such impurities may move into the space SP corresponding to the additional groove 440 to be positioned in the space SP. Accordingly, the probability of occurrence of defects in a manufacturing operation of a display apparatus may be dramatically reduced.

As described above with reference to FIG. 1, the reflective layer 403 does not cover at least a portion of each of the first bottom surface 410*a* (in the +Z direction) of the first groove 410, the second bottom surface 420*a* (in the +Z direction) of the second groove 420, and the third bottom surface 430*a* (in the +Z direction) of the third groove 430. This may be to allow light to be emitted from the first pixel PX1 to the third pixel PX3 to the outside. As another example, the bottom surface 440*a* (in the +Z direction) of the additional groove 440 may be covered with the reflective layer 403. This may be because, in a manufacturing operation of the display apparatus, a metal layer is formed on the entire surface of the lower surface 400*b* of the upper substrate 400 by using a sputtering method or the like, and portions of the metal layer on the bottom surfaces 410*a* to 430*a* of the first groove 410 to the third groove 430 are removed by using a photoresist.

Figure 14:
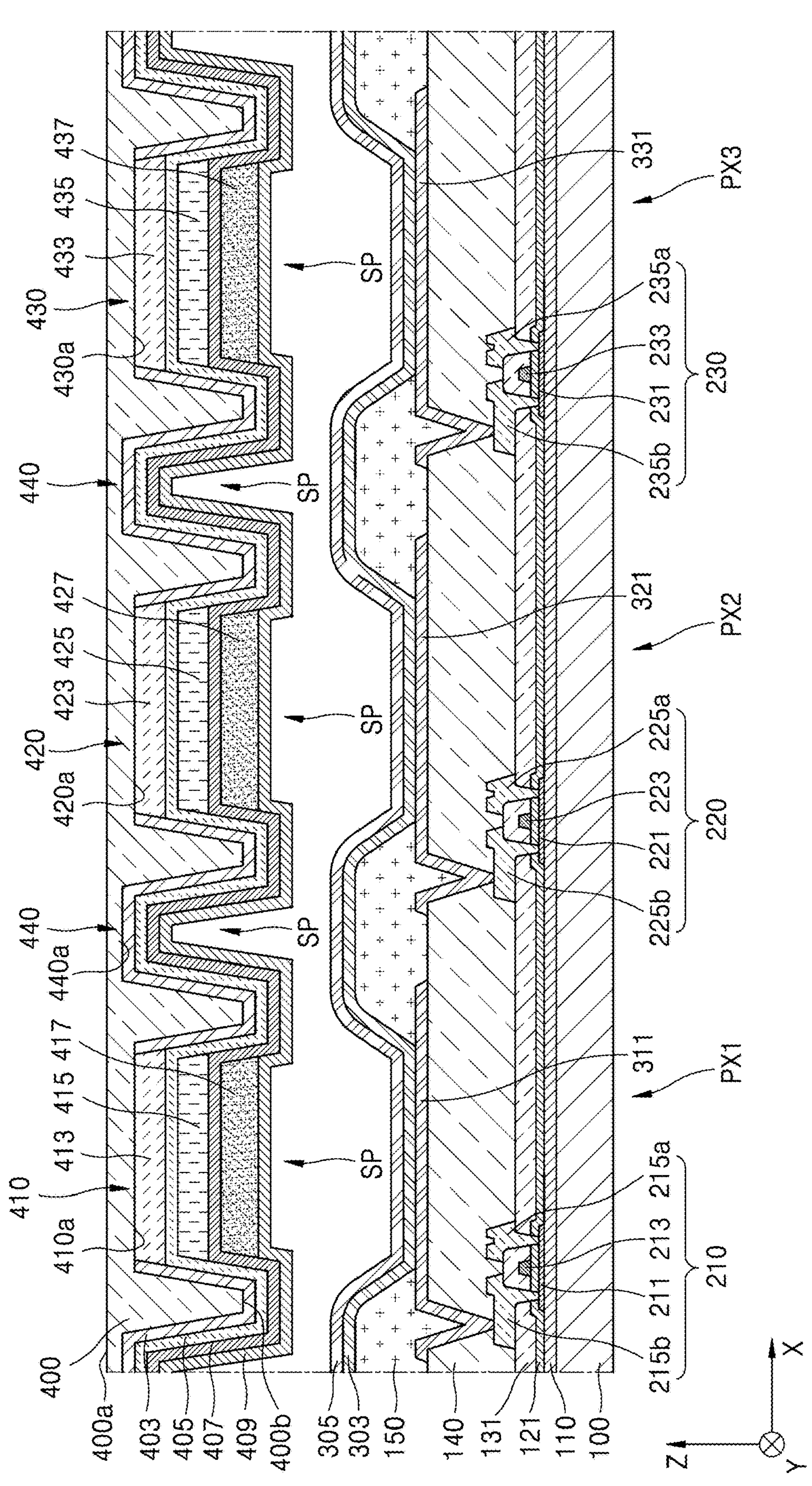
FIG. 14 is a cross-sectional view schematically illustrating a portion of a display apparatus according to an embodiment.

The space SP as described above may be not formed only in the additional groove 440, but may be formed in other places as well. For example, as shown in FIG. 14, which may be a cross-sectional view schematically illustrating a portion of a display apparatus according to an embodiment, the space SP may be formed in at least one of the first groove 410 to the third groove 430. In at least one of the first groove 410 to the third groove 430, a step-difference may be formed between a first portion which is a part of a surface of the third protective layer 409 in the direction (−Z direction) of the lower substrate 100 and may be over a bottom surface (in the +Z direction) of the at least one groove, and a second portion which is another part of the surface of the third protective layer 409 in the direction (−Z direction) of the lower substrate 100 and may be outside the first groove 410 to the third groove 430. Accordingly, in the at least one groove, the space SP corresponding to the at least one groove may be formed on a surface of the third protective layer 409 facing the lower substrate 100. This may be applied even in case that the upper substrate 400 does not have the additional groove 440. As a result, even in case that impurities exist between the upper substrate 400 and the lower substrate 100 during a bonding operation, such impurities may move into the space SP to be positioned in the space SP. Accordingly, the probability of occurrence of defects in a manufacturing operation of a display apparatus may be dramatically reduced. In an embodiment, FIG. 14 illustrates that the space SP is formed in each of the first groove 410 to the third groove 430.

Figure 15:
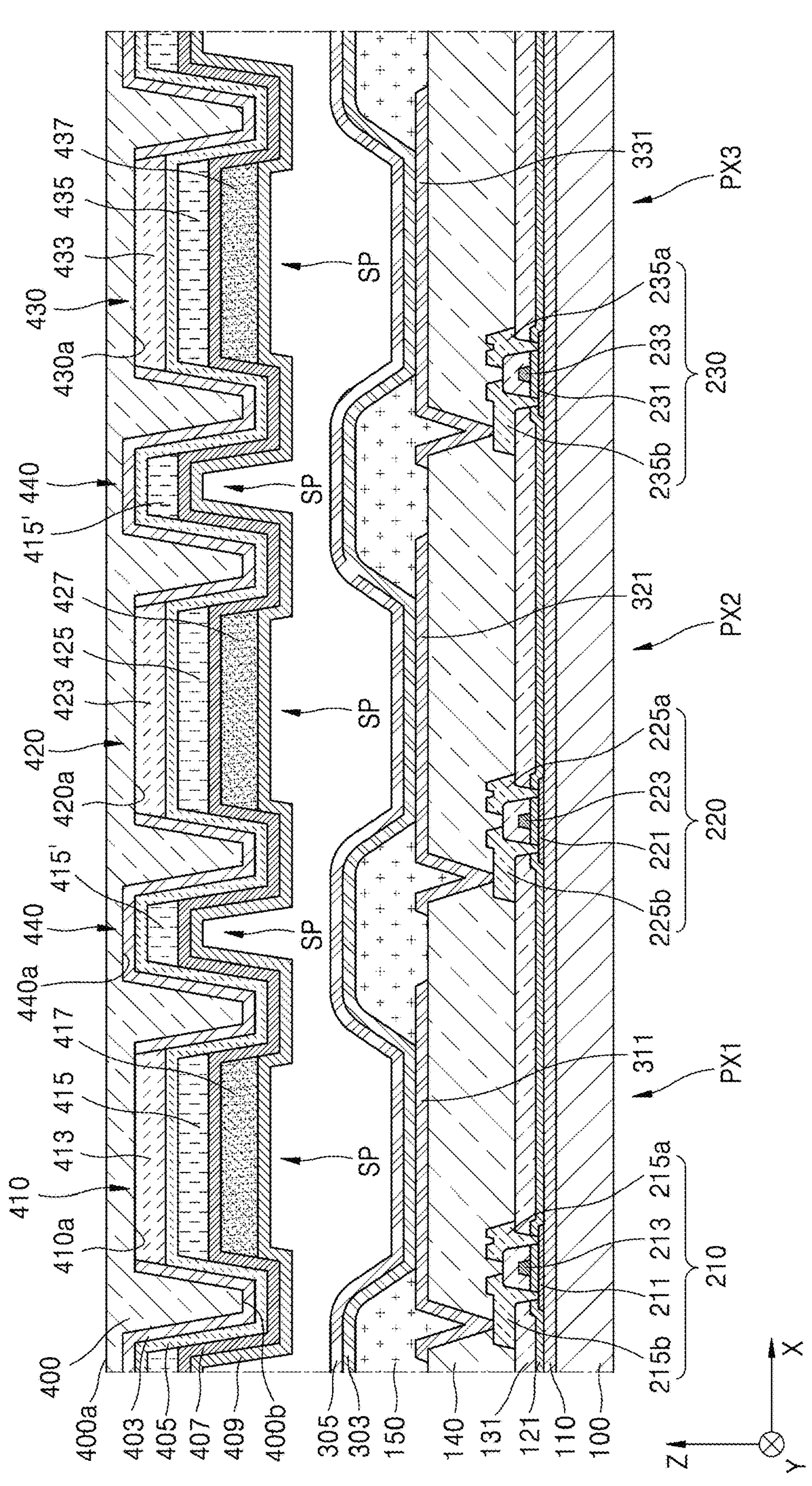
FIG. 15 is a cross-sectional view schematically illustrating a portion of a display apparatus according to an embodiment.

FIGS. 12 and 14 illustrate that only the reflective layer 403, the first protective layer 405, the second protective layer 407, and the third protective layer 409 are present in the additional groove 440, but the disclosure is not limited thereto. For example, as shown in FIG. 15, which is a cross-sectional view schematically illustrating a portion of a display apparatus according to an embodiment, an additional low-refractive-index layer 415' may also be located in the additional groove 440. The additional low-refractive-index layer 415' may be disposed between the first protective layer 405 and the second protective layer 407 in the additional groove 440. The third protective layer 409 may contact the second protective layer 407 in the additional groove 440. As such, even in case that the additional low-refractive-index layer 415' is present in the additional groove 440, a color-filter layer and a quantum dot or a transparent layer may be not in the additional groove 440, and thus, the space SP may be formed.

The light conversion efficiency of the second-color quantum dot layer 427 may be different from the light conversion efficiency of the third-color quantum dot layer 437. An amount of a quantum dot layer having low light conversion efficiency may be greater than an amount of a quantum dot layer having high light conversion efficiency. For example, as shown in FIG. 13, an area of the second groove 420 in which the second-color quantum dot layer 427 is to be positioned may be made greater than an area of the third groove 430 in which the third-color quantum dot layer 437 is to be positioned, so that the volume of the second-color quantum dot layer 427 may be greater than the volume of the third-color quantum dot layer 437. As another example, the depth of the second groove 420 may be made greater than the depth of the third groove 430, so that the volume of the second-color quantum dot layer 427 may be greater than the volume of the third-color quantum dot layer 437.

A display apparatus having organic light-emitting devices as display elements has been described, but the disclosure is not limited thereto. For example, in a structure as shown in FIG. 1, display elements connected to the first to third thin-film transistors 210, 220, and 230 may be other light-emitting elements other than organic light-emitting devices. For example, instead of the pixel electrodes 311, 321, and 331, the intermediate layer 303, and the opposite electrode 305, a first light-emitting element may be connected to the first thin-film transistor 210, a second light-emitting element may be connected to the second thin-film transistor 220, and a third light-emitting element may be connected to the third thin-film transistor 230. Each of the first light-emitting element to the third light-emitting element may include a first-color emission layer. The first-color emission layer may emit light having a wavelength in a first wavelength band, for example, may emit light having a wavelength in a range of about 450 nm to about 495 nm.

For example, in the display apparatus according to the above-described embodiment, the first light-emitting element to the third light-emitting element of the display apparatus may respectively have the first pixel electrode 311 to the third pixel electrode 331 and the opposite electrode 305 corresponding to the first pixel electrode 311 to the third pixel electrode 331, and the first-color emission layers of the first light-emitting element to the third light-emitting element may be respectively disposed on the first pixel electrode 311 to the third pixel electrode 331 to be disposed between the first pixel electrode 311 to the third pixel electrode 331 and the opposite electrode 305. As another example of the first light-emitting element to the third light-emitting element, nano light-emitting diodes (LEDs) may be included. This may be a type of LED, and the size thereof may be about the size of a pixel of a display apparatus.

A method of manufacturing a display apparatus also falls within the scope of the disclosure. For example, a display apparatus may be manufactured by forming the first groove 410 to the third groove 430 in the upper substrate 400, forming the reflective layer 403 having the shape as described above, forming the first-color color filter layer 413 to the third-color color filter layer 433 respectively in the first groove 410 to the third groove 430 by using an inkjet printing method, forming the first protective layer 405 by a CVD method, forming the first low-refractive-index layer 415 to the third low-refractive-index layer 435 respectively in the first groove 410 to the third groove 430 using the inkjet printing method again, forming the second protective layer 407 by the CVD method, forming the transparent layer 417, the second-color quantum dot layer 427, and the third-color quantum dot layer 437 respectively in the first groove 410 to the third groove 430 by using the inkjet printing method, forming the third protective layer 409 by the CVD method, and bonding the upper substrate 400 to the lower substrate 100. The above descriptions of the additional groove 440, the additional low-refractive-index layer 415', the space SP, or the like may also be applied to the method of manufacturing a display apparatus.

According to the embodiment as described above, a display apparatus having a low defect rate in a manufacturing operation thereof and in which an amount of materials consumed in the manufacturing operation thereof may be reduced may be implemented. The scope of the disclosure is not limited by these effects.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display apparatus comprising:

a lower substrate;

a first light-emitting element, a second light-emitting element, and a third light-emitting element, each of which is disposed over the lower substrate and comprises a first-color emission layer;

an upper substrate having a first groove, a second groove, a third groove, and an additional groove in a lower surface of the upper substrate facing the lower substrate, and disposed over the lower substrate such that the first light-emitting element, the second light-emitting element, and the third light-emitting element are disposed between the upper substrate and the lower substrate;

a reflective layer disposed on an entire inner side surface of each of the first groove, the second groove, and the third groove, the reflective layer contacting a bottom surface of each of the first groove, the second groove, and the third groove;

a first-color color filter layer and a first low-refractive-index layer located in the first groove, the first-color color filter layer contacting the bottom surface of the first groove, a side surface of the first-color color filter contacting the reflective layer;

a second-color color filter layer, a second low-refractive-index layer, and a second-color quantum dot layer located in the second groove, the second-color color filter layer contacting the bottom surface of the second grove, a side surface of the second-color color filter contacting the reflective layer;

a third-color color filter layer, a third low-refractive-index layer, and a third-color quantum dot layer located in the third groove, the third-color color filter layer contacting the bottom surface of the third groove, a side surface of the third-color color filter contacting the reflective layer, a first protective layer between the upper substrate and the lower substrate;

a second protective layer between the first protective layer and the lower substrate;

a third protective layer between the second protective layer and the lower substrate; and an additional low refractive index layer located in the additional groove and disposed between the first protective layer and the second protective layer;

wherein the third protective layer contacts the second protective layer in the additional groove.

2. The display apparatus of claim 1, wherein the first light-emitting element, the second light-emitting element, and the third light-emitting element further comprise:

a first pixel electrode, a second pixel electrode, and a third pixel electrode; and an opposite electrode corresponding to the first pixel electrode, the second pixel electrode, and the third pixel electrode, and the first-color emission layer is disposed over the first pixel electrode, the second pixel electrode, and the third pixel electrode, to be disposed between the first pixel electrode to the third pixel electrode and the opposite electrode.

3. The display apparatus of claim 1, wherein the first-color emission layer emits light in a first wavelength band, the second-color quantum dot layer converts the light in the first wavelength band into light in a second wavelength band, and the third-color quantum dot layer converts the light in the first wavelength band into light in a third wavelength band.

4. The display apparatus of claim 1, wherein the reflective layer covers a portion of the lower surface of the upper substrate, the portion being outside the first groove, the second groove, and the third groove.

5. The display apparatus of claim 1, wherein the second-color quantum dot layer is disposed between the second-color color filter layer and the second light-emitting element, the third-color quantum dot layer is disposed between the third-color color filter layer and the third light-emitting element, the first low-refractive-index layer is disposed between the first-color color filter layer and the first light-emitting element, the second low-refractive-index layer is disposed between the second-color color filter layer and the second-color quantum dot layer, and the third low-refractive-index layer is disposed between the third-color color filter layer and the third-color quantum dot layer.

6. The display apparatus of claim 5, wherein the first protective layer is disposed between the first-color color filter layer and the first low-refractive-index layer, between the second-color color filter layer and the second low-refractive-index layer, and between the third-color color filter layer and the third low-refractive-index layer.

7. The display apparatus of claim 6, wherein the first protective layer is integral as a single body over an entire surface of the upper substrate.

8. The display apparatus of claim 6, wherein the second protective layer is disposed between the second low-refractive-index layer and the second-color quantum dot layer and between the third low-refractive-index layer and the third-color quantum dot layer.

9. The display apparatus of claim 8, wherein the second protective layer is integral as a single body over an entire surface of the upper substrate.

10. The display apparatus of claim 8, further comprising:

a transparent layer in the first groove to be disposed between the first low-refractive-index layer and the first light-emitting element.

11. The display apparatus of claim 10, wherein the second protective layer is disposed between the first low-refractive-index layer and the transparent layer.

12. The display apparatus of claim 8, wherein the second protective layer contacts the first protective layer over a portion of the lower surface of the upper substrate, the portion being outside the first groove, the second groove, and the third groove.

13. The display apparatus of claim 8, wherein the third protective layer is disposed between the second-color quantum dot layer and the second light-emitting element and between the third-color quantum dot layer and the third light-emitting element.

14. The display apparatus of claim 13, wherein the third protective layer is integral as a single body over an entire surface of the upper substrate.

15. The display apparatus of claim 13, wherein the third protective layer contacts the second protective layer on a portion of the lower surface of the upper substrate, the portion being outside the first groove, the second groove, and the third groove.

16. The display apparatus of claim 13, wherein the second protective layer contacts the first protective layer over a bottom surface of the additional groove, and the third protective layer contacts the second protective layer over the bottom surface of the additional groove.

17. The display apparatus of claim 16, wherein a step-difference is formed between a first portion of a surface of the third protective layer facing the lower substrate and a second portion of the surface of the third protective layer facing the lower substrate, the first portion is disposed over the bottom surface of the additional groove, and the second portion is outside the first groove, the second groove, the third groove, and the additional groove.

18. The display apparatus of claim 1, wherein in at least one groove of the first groove, the second groove, and the third groove, a step-difference is formed between a first portion of a surface of the third protective layer facing the lower substrate and a second portion of the surface of the third protective layer facing the lower substrate, the first portion is disposed over a bottom surface of the at least one groove, and the second portion is outside the first groove, the second groove, and the third groove.

19. The display apparatus of claim 1, wherein when viewed from a direction perpendicular to the upper substrate, the first groove, the second groove, and the third groove respectively overlap the first light-emitting element, the second light-emitting element, and the third light-emitting element.

* * * * *